(12) United States Patent
Fukuda et al.

(10) Patent No.: US 10,317,939 B2
(45) Date of Patent: Jun. 11, 2019

(54) NECKBAND TYPE COMPUTER

(71) Applicant: WESTUNITIS CO., LTD., Osaka (JP)

(72) Inventors: Takahito Fukuda, Osaka (JP);
Tadatoshi Kinoshita, Osaka (JP)

(73) Assignee: WESTUNITIS CO., LTD., Osaka (JP)

( * ) Notice: Subject to any disclaimer, the term of this patent is extended or adjusted under 35 U.S.C. 154(b) by 308 days.

(21) Appl. No.: 15/340,265

(22) Filed: Nov. 1, 2016

(65) Prior Publication Data
US 2017/0308115 A1 Oct. 26, 2017

(30) Foreign Application Priority Data

Apr. 26, 2016 (JP) ................ 2016-088359

(51) Int. Cl.
G06F 1/16 (2006.01)
H04N 7/18 (2006.01)
(Continued)

(52) U.S. Cl.
CPC ............ *G06F 1/163* (2013.01); *G06F 3/0426* (2013.01); *H04N 5/2257* (2013.01); *H04N 7/185* (2013.01); *H04N 9/3129* (2013.01); *H04N 9/3173* (2013.01); *H04N 9/3185* (2013.01); *H04N 9/3194* (2013.01)

(58) Field of Classification Search
CPC .... H04N 9/3129; H04N 7/185; H04N 9/3173; H04N 9/3194; G06F 1/163; G06F 3/0426
See application file for complete search history.

(56) References Cited

U.S. PATENT DOCUMENTS 4,736,219 A * 4/1988 Yamanaka ............. G03B 17/04
396/419
6,249,427 B1 * 6/2001 Carroll .................. G06F 1/1616
361/679.03
(Continued)

FOREIGN PATENT DOCUMENTS

CA 2323899 9/1999
EP 3007029 4/2016
(Continued)

OTHER PUBLICATIONS

European Search Report for European Patent Application No. 16206744.1, dated Dec. 11, 2017.
(Continued)

*Primary Examiner* — Sathyanaraya V Perungavoor
*Assistant Examiner* — Philip P. Dang
(74) *Attorney, Agent, or Firm* — Jason H. Vick; Sheridan Ross, PC

(57) ABSTRACT

To provide a wearable computer excellent in extendibility and capable of being stably worn. A main body 2 which is equipped with cases 4, 6 and a flexible arm 8 is ring shaped main body having a part opened. The case 4 includes therein a computer, etc. The case 6 includes therein a battery for supplying electric power to the computer, etc. The flexible arm 8 is flexible and thus can be easily deformed. A connector case 10 is provided at a center portion of the flexible arm 8. The connector case 10 is provided with connectors for external device connection 36, 36, . . . In the present embodiment, a USB connector is employed as the connectors for external device connection 36, 36, . . .

18 Claims, 34 Drawing Sheets

(51) Int. Cl.
*H04N 9/31* (2006.01)
*G06F 3/042* (2006.01)
*H04N 5/225* (2006.01)

(56) References Cited

U.S. PATENT DOCUMENTS

| | | | | |
|---|---|---|---|---|
| 6,641,311 | B2* | 11/2003 | Yoshida | G03B 17/04 396/448 |
| 6,798,391 | B2* | 9/2004 | Peterson | G06F 1/163 345/8 |
| 7,057,660 | B1* | 6/2006 | Okuda | G03B 17/02 348/373 |
| 7,665,913 | B2* | 2/2010 | Kim | H04M 1/0202 396/448 |
| 7,899,318 | B2* | 3/2011 | Kamada | H04N 1/00323 396/223 |
| 8,228,202 | B2* | 7/2012 | Buchner | G06F 1/163 340/573.1 |
| 8,684,900 | B2* | 4/2014 | Tran | A61B 8/488 600/3 |
| 9,826,561 | B2* | 11/2017 | Bolin | H04W 76/14 |
| 2002/0084990 | A1 | 7/2002 | Peterson, III | |
| 2007/0016957 | A1* | 1/2007 | Seaward | G06F 3/03543 726/26 |
| 2007/0156594 | A1* | 7/2007 | McGucken | G06F 21/10 705/51 |
| 2007/0200822 | A1* | 8/2007 | Iso | G06F 3/0425 345/156 |
| 2007/0255965 | A1* | 11/2007 | McGucken | G06F 21/10 713/193 |
| 2009/0138636 | A1 | 5/2009 | Burton et al. | |
| 2010/0239242 | A1* | 9/2010 | Ka | G03B 11/043 396/448 |
| 2014/0270318 | A1* | 9/2014 | Cho | A44C 5/0015 381/385 |
| 2014/0282059 | A1* | 9/2014 | Oh | G06F 1/1641 715/744 |
| 2015/0016035 | A1* | 1/2015 | Tussy | G06F 1/163 361/679.03 |
| 2015/0123785 | A1* | 5/2015 | Haflinger | A61B 5/6831 340/539.11 |
| 2015/0188861 | A1* | 7/2015 | Esplin | H04L 51/06 709/206 |
| 2015/0196101 | A1* | 7/2015 | Dayal | A61H 3/061 63/1.11 |
| 2015/0201181 | A1 | 7/2015 | Moore et al. | |
| 2015/0215440 | A1* | 7/2015 | Park | H04M 1/05 455/569.1 |
| 2015/0286813 | A1* | 10/2015 | Jakobsson | G06F 21/35 726/9 |
| 2015/0326045 | A1* | 11/2015 | Choi | H02J 7/0044 320/107 |
| 2015/0326997 | A1* | 11/2015 | Agardh | H04W 4/80 455/41.2 |
| 2015/0347114 | A1* | 12/2015 | Yoon | G06F 8/61 235/375 |
| 2015/0355723 | A1* | 12/2015 | Nakura-Fan | G06F 3/023 345/168 |
| 2015/0366504 | A1* | 12/2015 | Connor | A61B 5/6804 600/301 |
| 2016/0033582 | A1* | 2/2016 | You | G06K 9/00536 324/427 |
| 2016/0062118 | A1* | 3/2016 | Osterhout | G02B 27/0172 345/8 |
| 2016/0062125 | A1* | 3/2016 | Baek | G02B 27/0176 361/679.01 |
| 2016/0062454 | A1* | 3/2016 | Wang | G09G 5/003 345/633 |
| 2016/0066295 | A1* | 3/2016 | Han | G06F 3/013 345/8 |
| 2016/0098138 | A1* | 4/2016 | Park | G06F 3/0416 345/173 |
| 2016/0103424 | A1* | 4/2016 | Shin | G04G 7/00 368/29 |
| 2016/0275771 | A1* | 9/2016 | Visweswara | A61B 5/6822 |

FOREIGN PATENT DOCUMENTS

| | | |
|---|---|---|
| JP | 2002-507065 A | 3/2002 |
| JP | 2002-229670 A | 8/2002 |
| JP | 2004-348440 A | 12/2004 |
| JP | 5550077 B2 | 7/2014 |
| JP | 2014-142899 A | 8/2014 |
| JP | 2015-011694 A | 1/2015 |
| JP | 3198243 U | 6/2015 |

OTHER PUBLICATIONS

European Search Report for European Patent Application No. 16206744.1, dated Aug. 2, 2017.

* cited by examiner

FIG.5
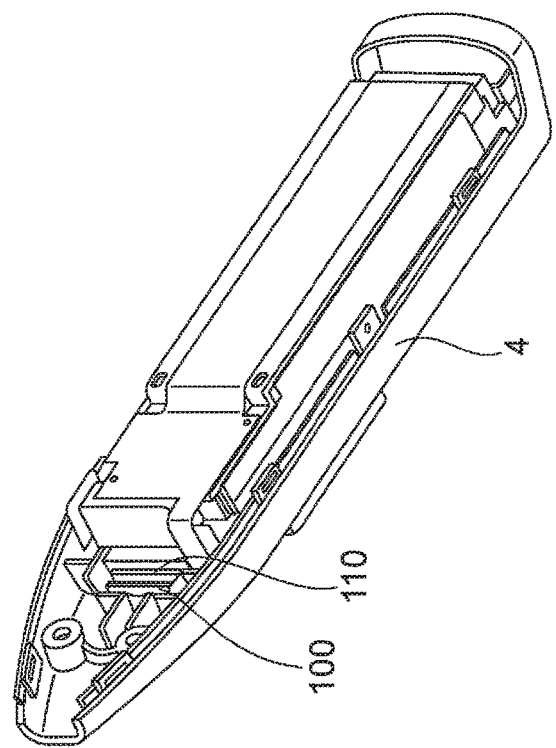
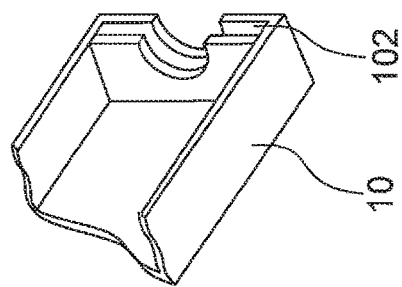

NECKBAND TYPE COMPUTER

CROSS REFERENCE TO RELATED APPLICATIONS

This application claims the benefit under 35 U.S.C. 119(a) to Japanese Patent Application No. 2016-088359 filed Apr. 26, 2016, the entire disclosure of which is incorporated herein by reference in its entirety.

TECHNICAL FIELD

The present invention relates to a neck band type computer.

BACKGROUND ART

According to practical use of a spectacle type wearable computer, a person can use a computer while wearing the computer on the body. The spectacle type wearable computer, however, was used by attaching it to a spectacle, which raised a problem of weight. Further, the person received a tensile force from a code for connecting an external device such as a camera, a display, etc., which also raised a problem of an unstable wearing condition.

JP2002-229670A discloses a body wearing type computer system in which a computer is housed in a collar of clothes. According to a device disclosed in JP2002-229670A, a computer, an earphone, a monitor, and a microphone are housed in the collar, and thus the above described problems have been solved.

SUMMARY OF INVENTION

However, in the conventional technology as disclosed in Patent Literature 1, special clothes are required, which makes it inconvenient to use the wearable computer. Further, in the spectacle type wearable computer, increase of connection to external devices invited serious problem of tensile forces received from codes of the external devices. This rendered a limit in extendibility. Also, in the device of Patent Literature 1, since an external device was preliminary built in the device, which also rendered a limit in extendibility.

A purpose of the present invention is to provide a wearable computer excellent in extendibility and capable of solving at least one of the above described problems and eliminating an unstable wearing condition.

Independently applicable characteristics of the present invention will be exemplified below.

(1) The neck band type wearable computer of the present invention includes a ring shaped main body having a part opened for wearing it around the neck, a computer built in the main body, a battery housed in the main body to supply electric power to the computer, and connectors for external device connection provided in the main body and connected to the computer.

With the above described structure, a wearable computer excellent in a stable wearing condition and extendibility can be obtained.

(2) The neck band type wearable computer of the present invention is characterized in that connectors are provided at a center portion of the ring shaped main body.

This contributes to reduce possibility of unstable rotation of the main body of the wearable computer when it receives a tensile force from a code connected to the connector. Namely, the wearable computer can keep a stable condition.

(3) The neck band type wearable computer of the present invention is characterized in further including a short-range communication circuit that is housed in the main body and connected to the computer.

This allows connection with the external device, etc. without using a physical code.

(4) The neck band type wearable computer of the present invention is characterized in that at least a part of the center portion of the main body is equipped with a flexible arm.

This allows a flexible change of a shape of the main body and suitable wearing around the neck.

(5) The neck band type wearable computer of the present invention is characterized in that the flexible arm is composed of a coil made of cylindrically coiled wires and a cover tube contacting a periphery of the coil, the cover tube being stretched so as to generate a contraction force in a direction in which the neighboring wires are brought into pressure contact with each other or being stretched so as to generate a contraction force in a radial direction by forming an inner diameter of the tube in a natural condition smaller than an outer diameter of the coil.

With the structure, a shape of the main body can be changed flexibly and the shape can be maintained, resulting in allowing suitable wearing around the neck.

(6) The neck band type wearable computer of the present invention is characterized in that the coil is made in a manner that a wire having a round cross section and a wire having an angular cross section are coiled such that the neighboring wires contact each other and are coiled in multiple streaks to be formed into a cylindrical coil.

With the structure, a shape of the main body can be changed flexibly and the shape can be maintained, resulting in allowing suitable wearing around the neck.

(7) The neck band type wearable computer of the present invention is characterized in that the cover tube is composed of a silicone tube.

With the structure, a shape of the main body can be changed flexibly and the shape can be maintained, resulting in allowing suitable wearing around the neck.

(8) The neck band type wearable computer of the present invention is characterized in that the main body has a plane shape which allows a planar contact with the back of the neck at its center portion contacting the back of the neck and has two cases which allow a planar contact with the chest at its both ends for a stable condition.

With the structure, a stable wearing can be achieved.

(9) The neck band type wearable computer of the present invention is characterized in that one of the cases houses a computer, and the other one of the cases houses a battery.

With the structure, the right and left weight balance can be maintained easily, resulting in achieving a stable wearing.

(10) The neck band type wearable computer of the present invention is characterized in that a fitting mechanism is provided in each of both ends of the ring shaped main body and an attachment connected between the both fitting mechanisms is further included.

With the attachment, a center of gravity comes to be positioned lower, which realizes a stable wearing condition.

(11) The neck band type wearable computer of the present invention is characterized in that, in one of the fitting mechanisms, the attachment is not detached when a force in a direction in which the attachment is pulled away from the main body is only applied, and, in the other one of the fitting mechanisms, the attachment is detached when a force in a direction in which the attachment is pulled away from the main body is applied.

With the structure, when an excessive force is applied while the attachment is attached, the attachment comes off from the main body. This can reduce the impact to the neck of a wearer.

(12) The neck band type wearable computer of the present invention is characterized in that the attachment is provided with an electronic device.

With the structure, change of the attachment enables use of various kinds of electronic devices.

(13) In the neck band type wearable computer of the present invention, the electronic device is a camera including a cover which openably/closably covers a lens of the camera, wherein a display hidden by the cover becomes visible or invisible according to a difference in a physical position of the cover between an opened state and a closed state of the cover.

With the structure, display suitably becomes visible/invisible according to a physical movement of the cover that covers the lens of the camera. This enables proper display whether or not the camera is in a state capable of capturing an image.

(14) The neck band type wearable computer of the present invention is characterized in that the electronic device is a projector, wherein the projector is a laser projector for applying a laser beam onto an object while scanning in response to a display signal and includes detection means for detecting whether or not a person or a part of a person is present in a direction in which a laser beam is applied at each scanning position and irradiation control means for performing, when a person or a part of a person is detected by the detection means while applying a laser beam during scanning, control of i) not applying a laser beam thoroughly or ii) not applying a laser beam in a direction in which a person or a part of a person was detected but applying a laser beam only in a direction in which a person or a part of a person was not detected.

With the structure, application of a laser beam to a face of a person is avoidable.

(15) The neck band type wearable computer of the present invention is characterized in that the electronic device includes a fixing means for fixing the electronic device to an object, and the attachment includes a housing recess for receiving the electronic device including fixing means and an attachment case provided with a code winding recess for winding the code around it.

With the structure, the electronic device can be detached from the attachment and fixed to a desired position when using it.

(16) The attachment of the present invention is an attachment to be attached to the main body via fitting mechanisms wherein the attachment includes an electronic device performing transfer of a signal via a code which have fixing means for fixing itself to an object, a housing recess for receiving the electronic device with the fixing means, and an attachment case provided with a code winding recess around which the code is wound.

With the structure, the electronic device can be detached from the attachment and fixed to a desired position when using it.

(17) The neck band type wearable computer of the present invention is a neck band type wearable computer which includes a ring shaped main body having a part opened for wearing it around the neck, a computer built in the main body, a battery housed in the main body for supplying electric power to the computer, and connectors for external device connection or a short-range communication device provided in the main body and connected to the computer, wherein, via communication by the connectors for external device connection or the short-range communication device, a projector and a detector are connected to the computer, the projector projecting an image of a keyboard onto an object, the detector acquiring input information by detecting movement of a finger on the keyboard projected on the object, the computer displaying a processing result on the monitor on the basis of the input information.

With the structure, if the neck band type wearable computer is placed near the monitor, it can be used like a desktop type computer.

(18) The wearable computer of the present invention includes a flexible arm to be wound around a part of a human body for wearing, storage cases attached to both ends of the flexible arm, a computer built in the storage case, and a battery housed in the storage case to supply electric power to the computer.

With the structure, the wearable computer can be used by being easily worn on a human body.

(19) The wearable computer of the present invention is characterized in further including a center case attached to a center of the flexible arm and connectors for external device connection provided in the center case and connected to the computer.

This contributes to reduce possibility of unstable rotation of the main body of the wearable computer when it receives a tensile force from a code connected to the connector. Namely, the wearable computer can keep a stable condition.

(20) The wearable computer of the present invention is characterized in that each of two storage cases is provided with an engaging mechanism for mutual engagement.

This enables a stable fixing therebetween.

(21) The wearable computer of the present invention is characterized in that the part of the human body is the wrist or the ankle.

With the structure, the wearable computer can be used by being wound around the wrist or the ankle.

(22) The camera device of the present invention includes a camera with a lens and a cover which openably/closably covers the lens of the camera, wherein a display hidden by the cover becomes visible or invisible according to a difference in a physical position of the cover between an opened state and a closed state of the cover.

With the structure, display becomes visible/invisible according to a physical movement of the cover that covers the lens of the camera. This enables proper display whether or not the camera is in a state capable of capturing an image.

(23) The laser projector of the present invention is a laser projector for applying a laser beam onto an object during scanning in response to a display signal, including detection means for detecting whether or not a person or a part of a person is present in a direction in which a laser beam is applied at each scanning position and irradiation control means for performing, when a person or a part of a person is detected by the detection means while a laser beam is applied during the scanning, control of i) not applying a laser beam thoroughly or ii) not applying a laser beam in a direction in which a person or a part of a person was detected but applying a laser beam only in a direction in which a person or a part of a person was not detected.

With the structure, application of a laser beam to a face of a person is avoidable.

BRIEF DESCRIPTION OF DRAWINGS

FIG. 5 illustrates interior structures of a case 4 and a connector case 10.

DESCRIPTION OF EMBODIMENTS

1. Basic Structure

Figure 1:
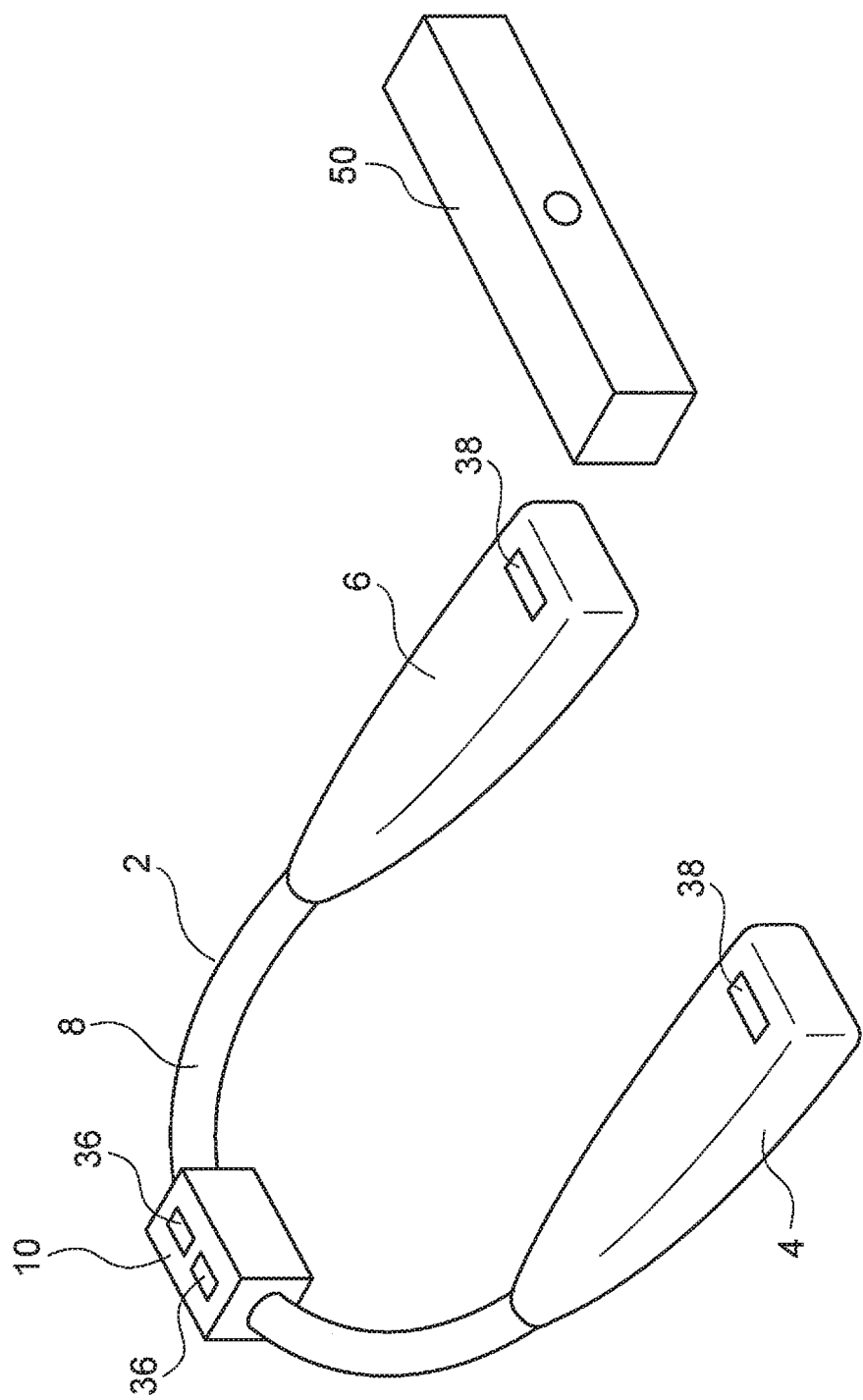
FIG. 1 illustrates an outer appearance of a neck band type wearable computer 2 according to an embodiment of the present invention.

An outer appearance of a neck band type wearable computer according to an embodiment of the present invention will be described below. A main body 2, including cases 4, 6 and a flexible arm 8, is, as a whole, formed into a ring shape having a part opened.

A computer, etc. is built in the case 4. A battery for supplying electric power to the computer, etc. is built in the case 6. The flexible arm 8 has flexibility and thus can be deformed. A center portion of the flexible arm 8 is provided with a connector case 10. The connector case 10 is provided with connectors for external device connection 36, 36, . . . In the present embodiment, a USB connector is used as the connectors for external device connection 36, 36, . . .

Fitting connectors 38, 38 are provided at around ends of the case 4. In the present embodiment, a USB connector is used also as the fitting connectors 38, 38. The fitting connectors 38, 38 serve to physically electrically connect an attachment 50 in a manner as described below.

Figure 2:
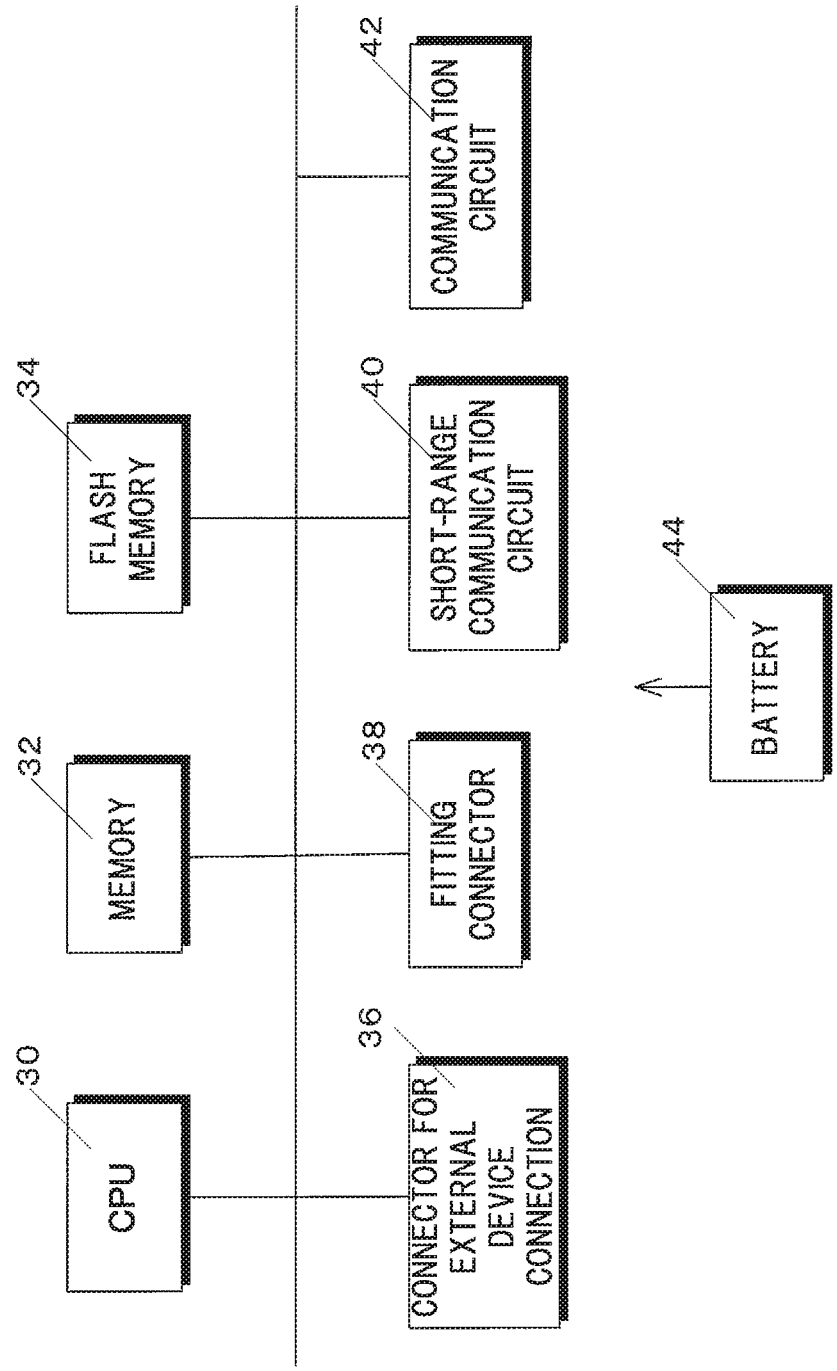
FIG. 2 illustrates a hardware structure of the neck band type wearable computer 2.

FIG. 2 illustrates a hardware structure of a computer built in the main body 2. A CPU 30 is connected to a memory 32, a flash memory 34, the USB connector 36, the fitting connector 38, a short-range communication circuit 40, and a communication circuit 42. A battery 44 supplies electric power to them.

In the present embodiment, the case 4 is provided therein with the CPU 30, the memory 32, the flash memory 34, the fitting connector 38, the short-range communication circuit 40, and the communication circuit 42, and the case 6 is provided therein with the battery 44. The connectors for external device connection 36 are built in the connector case 10.

The battery 44 is built in the case 6. A back side surface of the case 6 is provided with a cover (not shown). By removing the cover, the battery 44 can be taken out or put into the case 6.

Figure 3:
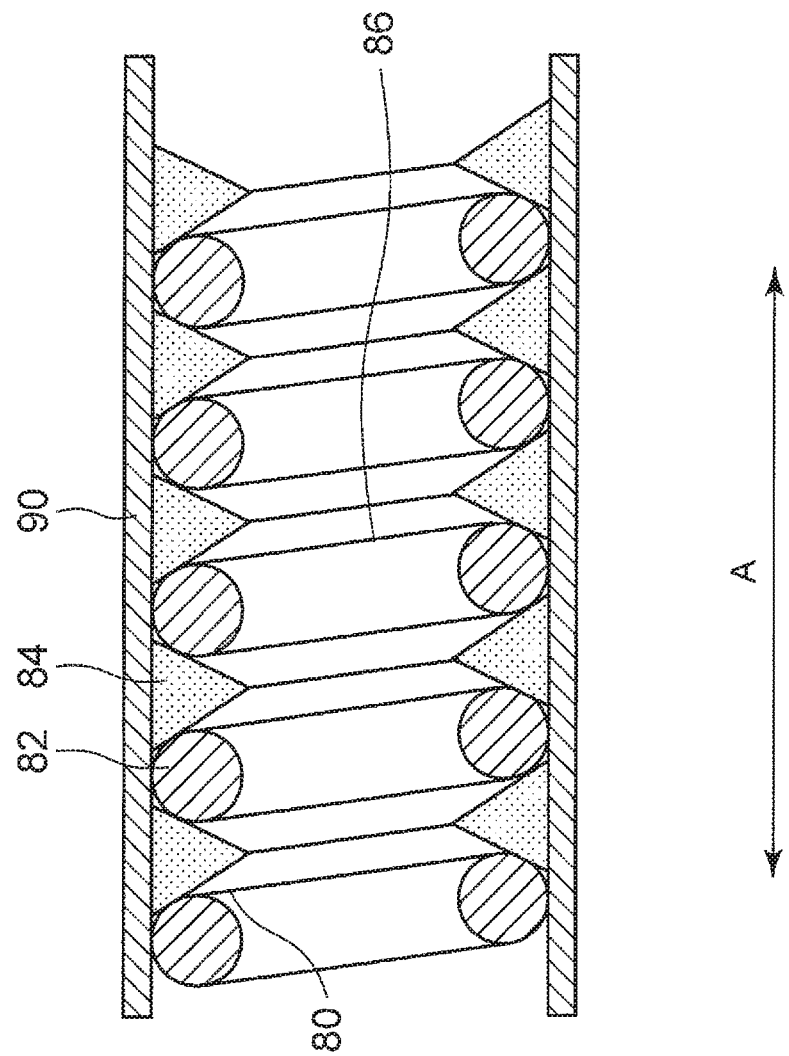
FIG. 3 illustrates a cross-sectional structure of a flexible arm 8.

Referring back to FIG. 1, the flexible arm 2 has flexibility, and thus a shape thereof can be adjusted by bending it. As illustrated in FIG. 3, the flexible arm 2 is composed of a coil 80 and a tube 90 covering an outer periphery of the coil 80. In an inner space of the coil 80, a power supply line (not shown) for making a connection between the battery 44 and the connectors for external device connection 36, and the CPU 30 and a bus line (not shown) for making a connection between the connectors for external device connection 36 and the CPU 30 are housed.

The coil 80 is formed into a double winding coil composed of a wire having a round cross section (SUS304WPB) 82 and a SUS wire having a triangular cross section (SUS304) 84. In the present embodiment, a diameter of the wire 82 is set to 0.8 mm, and a side of the wire 84 is set to 1.0 mm. The neighboring SUS wire (spring material) 82 and the SUS wire (spring material) 84 contact to each other. The SUS wire 84 having a triangular cross section is arranged such that a side of the triangular shape extends along the outer periphery, and a width thereof becomes narrower as it goes inside (or vice-verse).

A silicon tube 90 is provided in a manner that the tube contacts the outer periphery of the coil 80. In the present embodiment, the tube 90 having an inner diameter of 50 mm in its natural condition is used for the coil 80 having an outer diameter of 54 mm. As described above, because the outer diameter of the coil 80 is set slightly larger than the inner diameter of the tube 90 (about 5% to 15% of the tube diameter), the tube 90 tightly contacts the outer periphery of the coil 80.

Further, in the present embodiment, the tube 90 is brought into tight contact with the coil 80 while the tube 90 is stretched from its natural condition in an A direction of FIG. 3. With the structure, the tube 90 tends to contract according to its flexibility, a force can be applied to the coil 80 in a direction compressing the coil 80.

Figure 4A:
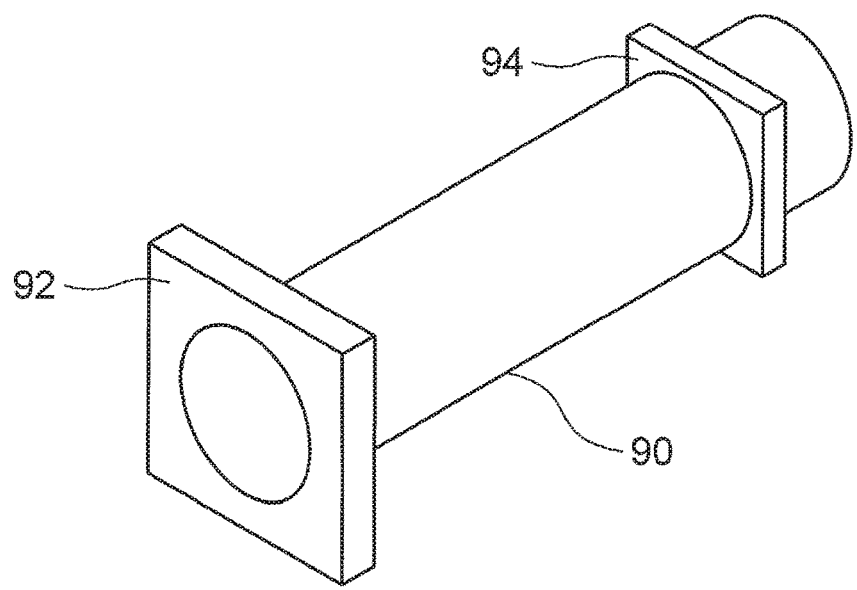
FIGS. 4a and 4b illustrate a tube 90 in detail.

FIG. 4A illustrates the tube 90 in detail. In the present embodiment, the tube 90 is made by molding a flexible silicon. Also, a flange 92 is provided on one end. A flange 94 is provided on the other end.

Figure 4B:
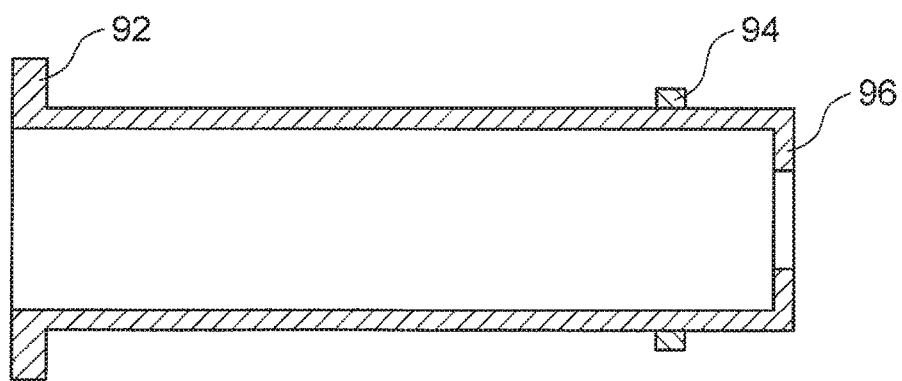

FIG. 4B illustrates a cross section of the tube 90. At the end where the flange 94 is provided, a stopper 96 having a hollow section of a diameter smaller than the inner diameter of the tube 90 is provided. This can prevent the coil 80 from being dropout.

FIG. 5 illustrates interior structures (states where covers are removed) of the main body 4 and the connector case 10. The main body 4 is provided with a recess portion 100 which receives a flange 92 of the tube 90. Although it is not shown, the corresponding recess portion is provided in the cover. A stopper 110 is provided next to the recess portion 100. The stopper 110 serves to keep the coil 80 at a predetermined position within the main body 4 when the flexible arm 8 is attached to the main body 4.

A recess portion 102 for receiving the flange 94 of the tube 90 is provided in the connector case 10. Although it is not shown, the corresponding recess portion is provided in the cover.

Figure 6A:
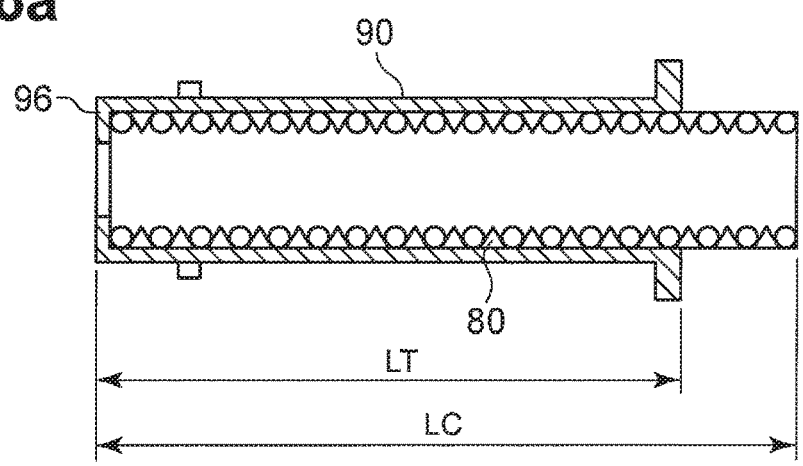
FIGS. 6a, 6b and 6c illustrate assembling of a coil 80 and a tube 90.

Subsequently, a step of attaching the flexible arm 8 to the main body 4 and the movable portion 6 will be described below. Initially, as illustrated in FIG. 6A, the coil 80 is put in the tube 90. At the time, the coil 80 is inserted into the tube 90 until one end of the coil 80 contacts the stopper 96 of the tube 90.

Figure 6B:
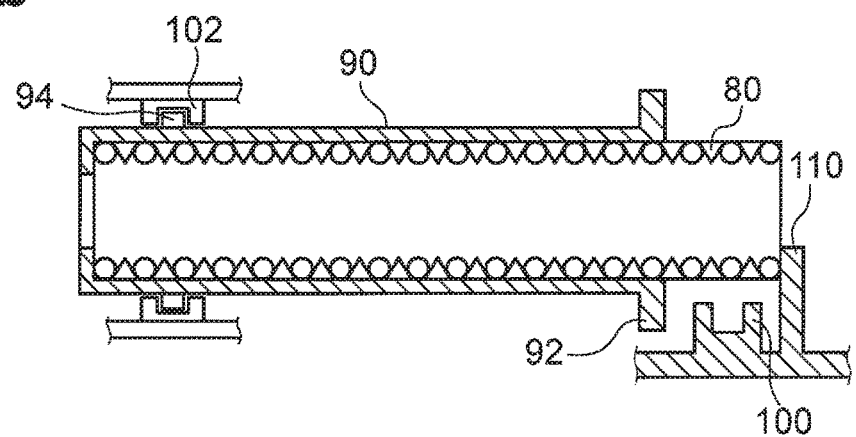

In the present embodiment, because a length LC (e.g., 60 mm) of the coil 80 is set longer than a length LT (e.g., 50 mm) of the tube 90 (LC is longer than LT by about 10% to 50% of the entire length of the tube 90), the coil 80 projects out as shown in FIG. 6A. As shown in FIG. 6B, while leaving the coil 80 as it is, the flange 94 of the tube 90 is pushed into the recess portion 102 of the movable portion 6 to fix it and, when the other end of the coil 80 is brought into contact with the stopper 110 of the main body 4, the flange 92 of the tube 90 will not be received in the recess portion 100 of the main body 4.

Figure 6C:
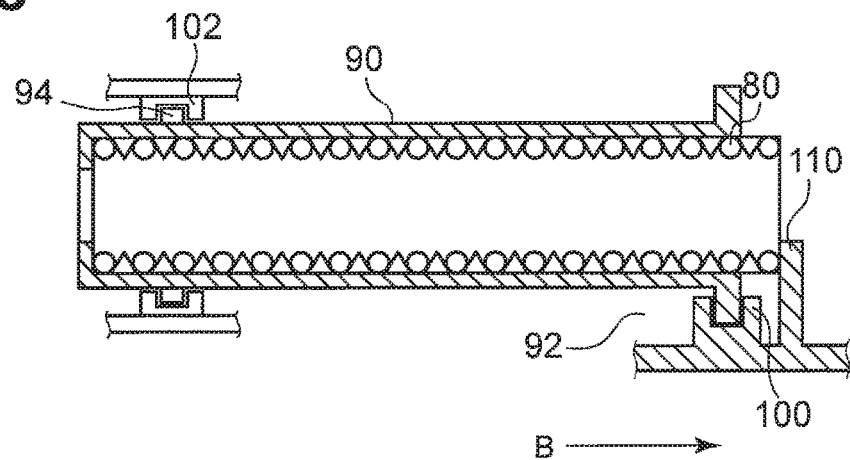

To avoid this, as illustrated in FIG. 6C, the tube 90 is once pulled in an arrow B direction, and the flange 92 of the tube 90 is engaged into the recess portion 100 of the main body 4. Then, the cover is put over the recess portion.

Figure 7:
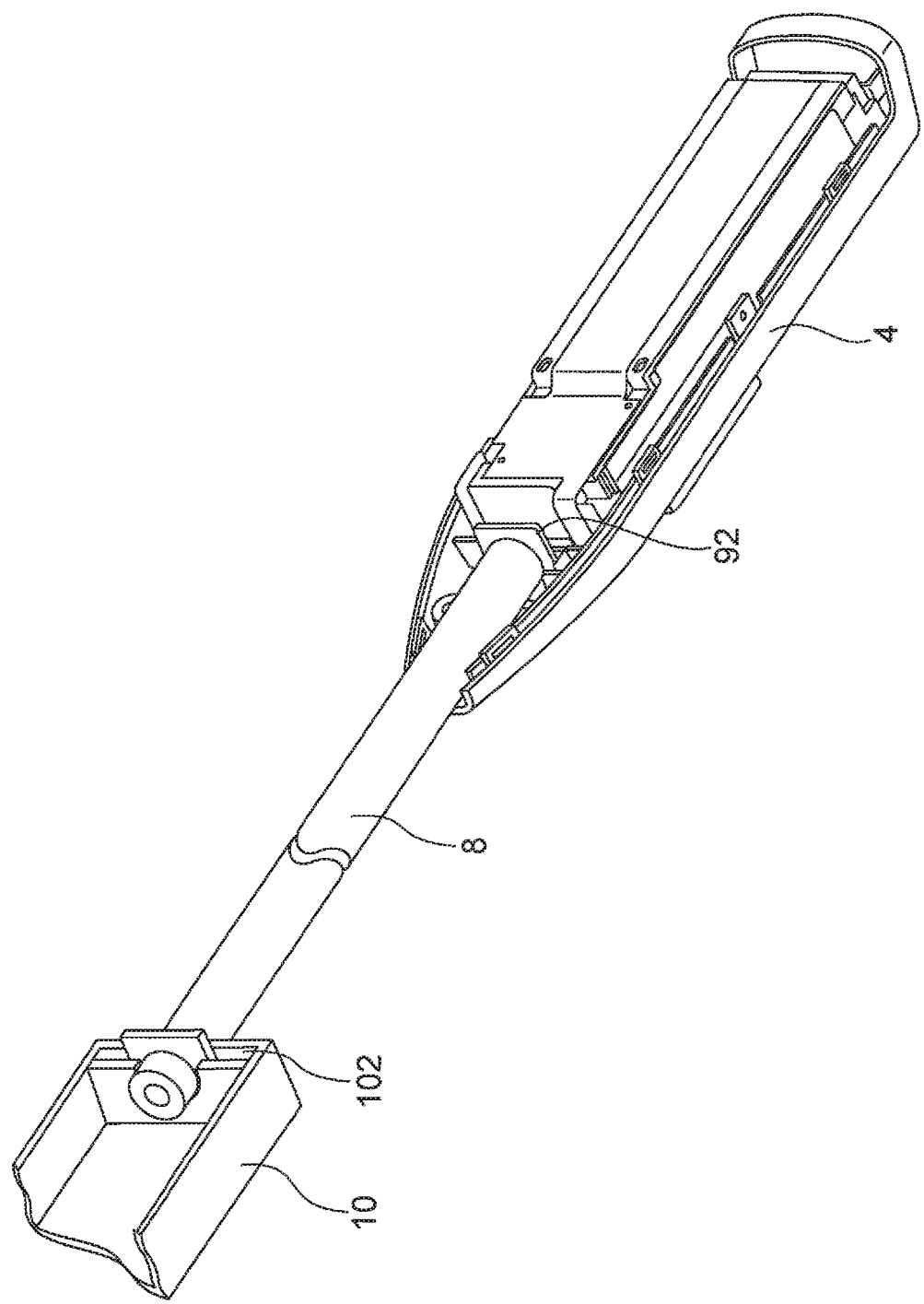
FIG. 7 illustrates a state of connection between the case 4 and the connector case 10 via the flexible arm 8.

Thus assembled state is illustrated in FIG. 7. Incidentally, the cover is omitted in FIG. 7.

In the present embodiment, the coil is formed into a double winding coil in a manner that a wire having a round cross section and a wire having a triangular cross section are neighbored each other. Therefore, when the flexible arm 8 is bent in a manner as illustrated in FIG. 1, a degree capable of keeping the bending state becomes higher. This is because, a coil composed of a wire having a round cross section and a wire having a triangular cross section which are neighbored has larger recovery resistance when the coil is bent than a coil composed of wires having a round cross section which are neighbored. This allows maintaining of the bending state. Further, since the inner diameter of the tube 90 is made smaller than the outer diameter of the coil 80, and still further, the tube 90 is brought into tight contact with the coil 80 while the tube 90 is stretched, the bending state can be maintained.

This produces an effect of easy adjustment of an angle and a position and an effect of maintaining of the adjusted position. Incidentally, at least one of setting the inner diameter of the tube 90 smaller than the outer diameter of the coil 80 (applying a force in a radial direction) or bringing the tube 90 into tight contact with the coil 80 while the tube 90 is stretched (applying a force in a direction in which the neighboring wires are compressed) may be executed.

In the above described embodiment, a double winding coil is used as the coil 80. A single winding coil may be used instead. Even in this case, the effect of maintaining a bending state according to the stretch/tight contact of the tube 90 can also be produced.

Further, instead of the double winding coil, a multi-winding coil coiled more than three times may be used. In this case, however, the coil is preferably made by a combination of a wire having a round cross section and a wire having a triangular cross section which are neighbored.

In the above described embodiment, the coil 80 is composed of a wire having a round cross section and a wire having a triangular cross section. A wire having a round cross section and a wire having a cross section of multangular shape more than square shape may be used instead. Alternatively, a wire having an angular (trapezoid, parallelogram, etc.) cross section other than the multangular cross section may be used.

In the above described embodiment, the force in a direction in which the tube 90 compresses the coil 80 is applied. Biasing means (flexible member, spring material, etc.) which is fixed to both ends of the coil 80 and biased in a shrinking direction may be provided instead.

As illustrated in FIG. 1, in the present embodiment, the attachment 50 can be attached to the ends of the cases 4, 6. A camera, a sensor, etc. can be housed in the attachment 50.

Figure 8:
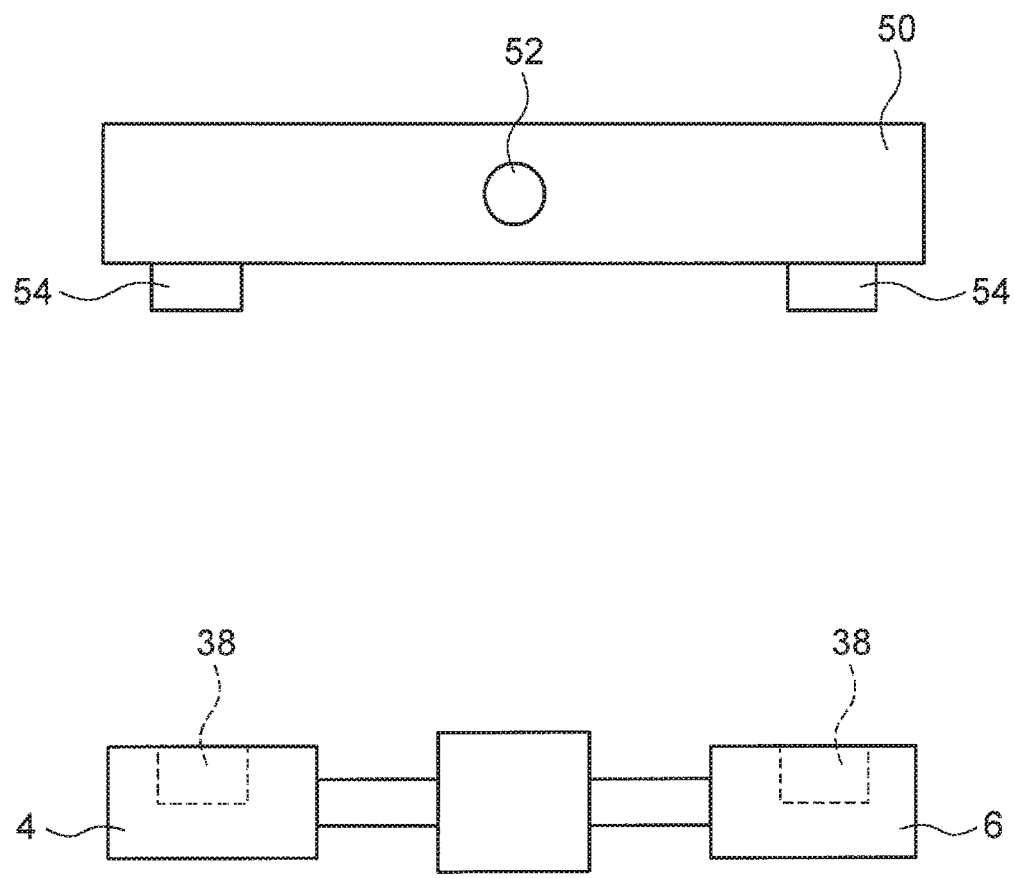
FIG. 8 illustrates a structure of an attachment 50.

FIG. 8 illustrates a structure of the attachment 50 provided with a camera 52. The attachment 50 is provided with the camera 52 at its center and male type connectors 54 (fitting connectors) of a micro-USB (or C-type USB) at its both ends. Female type connectors 38 (fitting connectors) are provided in the cases 4, 6 at positions corresponding to the male type connectors 54. By engaging the male type connectors 54 with the female type connectors 38, the attachment 50 can be mechanically electrically connected to the cases 4, 6.

Figure 9:
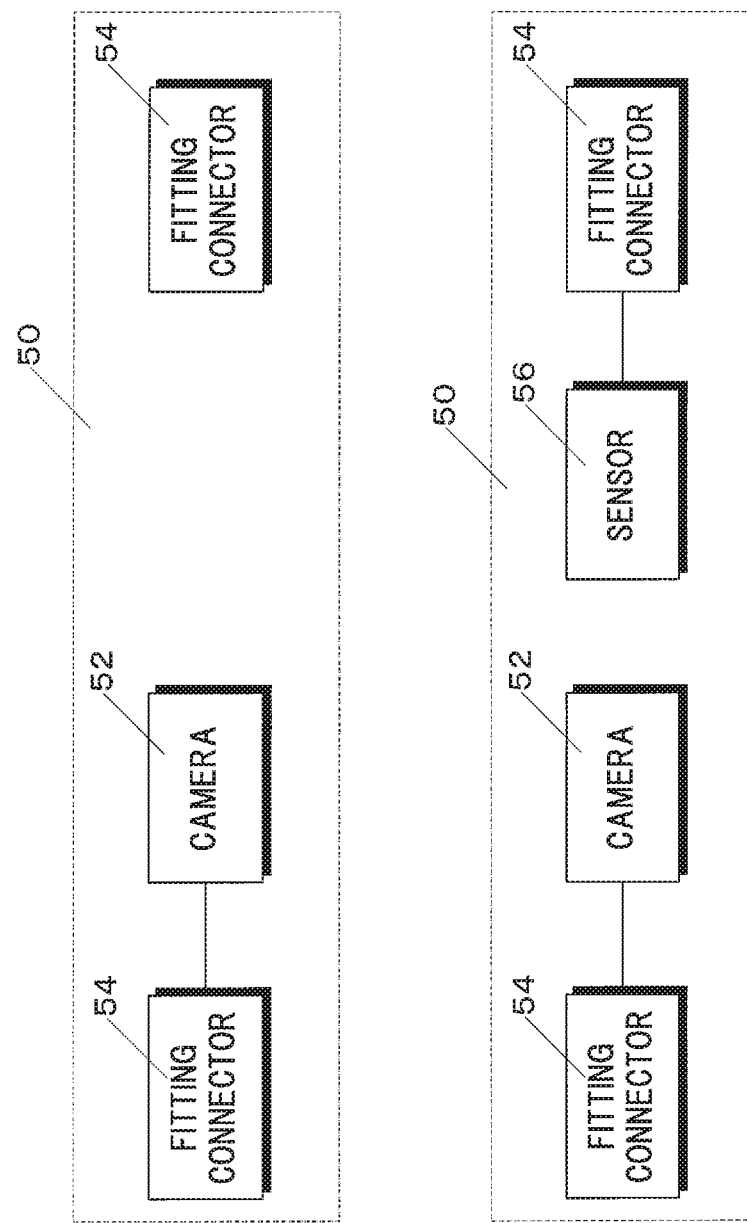
FIGS. 9a and 9b illustrate a hardware structure of the attachment 50.

FIG. 9A illustrates a circuit structure of the attachment 50. One of the fitting connectors 54 is connected to the camera 52. The other one of the fitting connectors 54 is connected to nothing, i.e., is left free.

In a case where a plurality of devices, e.g., the camera 52 and a sensor 56, is housed in the attachment 50, one of the fitting connectors 54 is connected to the camera and the other one of the fitting connectors 54 is connected to the sensor 56 as shown in FIG. 9B.

In a case of FIG. 9A, by attaching the attachment 50, the camera 52 can be connected to the CPU 30. In a case of FIG. 9B, by attaching the attachment 50, the sensor 56 can be connected to the CPU 30. Further, by attaching the attachment 50, an orientation of the attachment 50 becomes stable owing to its own weight. Further, since the neck band type wearable computer is worn around the neck, the attachment 50 would not move even when the head moves, thereby keeping a relatively stable orientation. In this meaning, it is preferable that the attachment 50 houses devices requiring a stable orientation, e.g., the camera 52, a projector, and the sensor 56.

Figure 10:
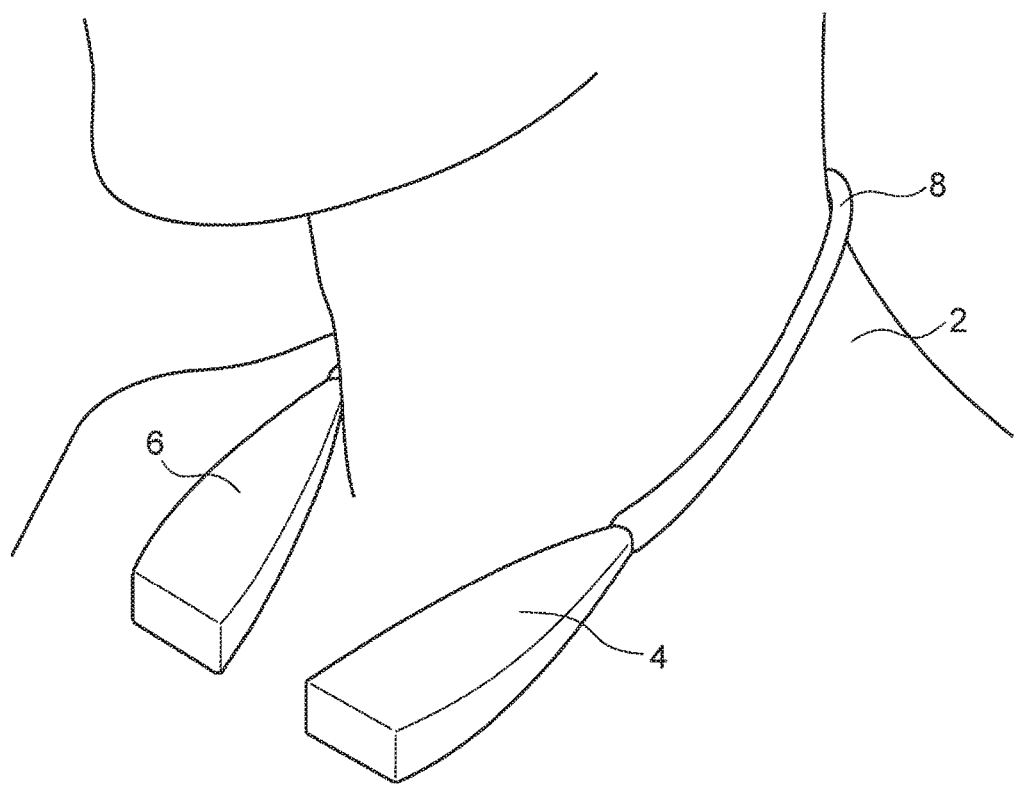
FIG. 10 illustrates a state of wearing the neck band type computer 2.

FIG. 10 illustrates a state that the neck band type wearable computer 2 is worn. In FIG. 10, a case where the attachment 50 is not attached is illustrated; however, the attachment 50 may be attached as required. The connector case 10 resides at the back of the neck so that it is hidden in FIG. 10.

The connectors for external device connection 36, 36, . . . of the connector case 10 is connected to an external device such as a head phone, a head mount display (HMD), or a laser projector.

2. Other Example of Fitting of Attachment

Figure 11:
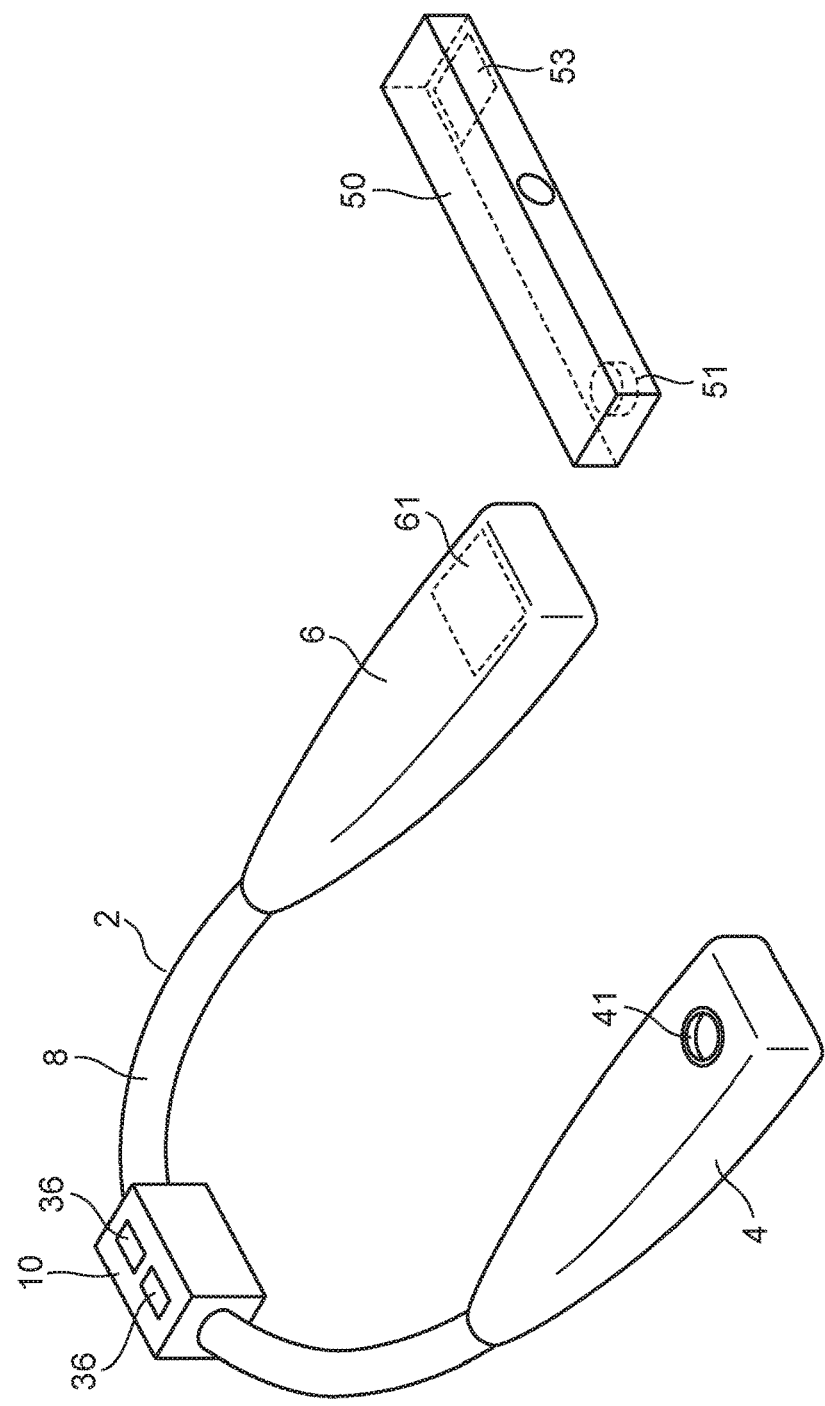
FIG. 11 illustrates another example of a fitting structure of the attachment.

FIG. 11 illustrates another example of a fitting structure of the attachment. The case 4 is provided with a fitting recess 41, and the case 6 is provided with a magnet 61 so as to be embedded in the case 6. A back surface of one end of the attachment 50 is provided with a fitting projection 51, and a back surface of the other end of the attachment 50 is provided with a magnet 53 so as to be embedded in the attachment 50.

Figure 12:
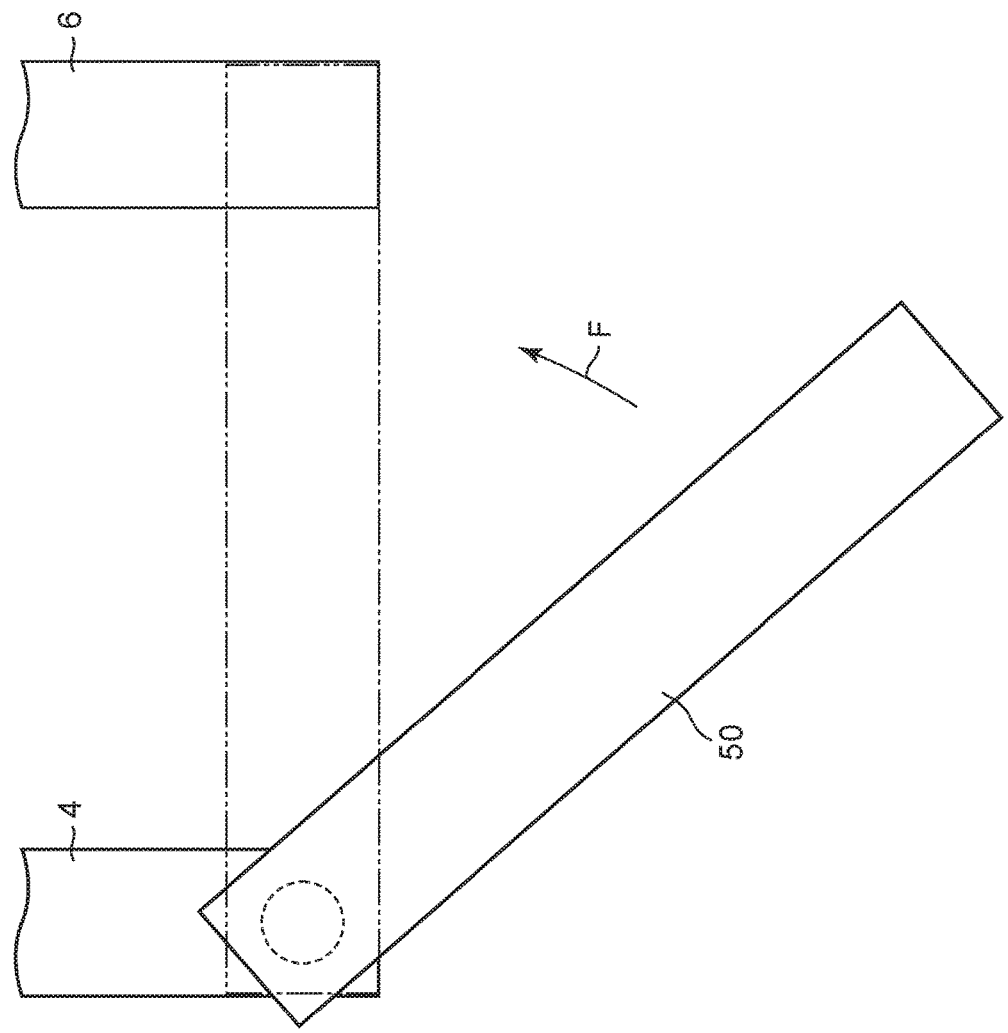
FIG. 12 illustrates how to fix the attachment 50 to the cases 4, 6.

FIG. 12 illustrates how to fix the attachment 50 to the cases 4, 6. Initially, as shown in FIG. 12, the attachment 50 is inclined by 45 degrees with respect to a line connecting ends of cases 4, 6. In this orientation, the fitting projection 51 is inserted into the fitting recess 41.

Figure 13A:
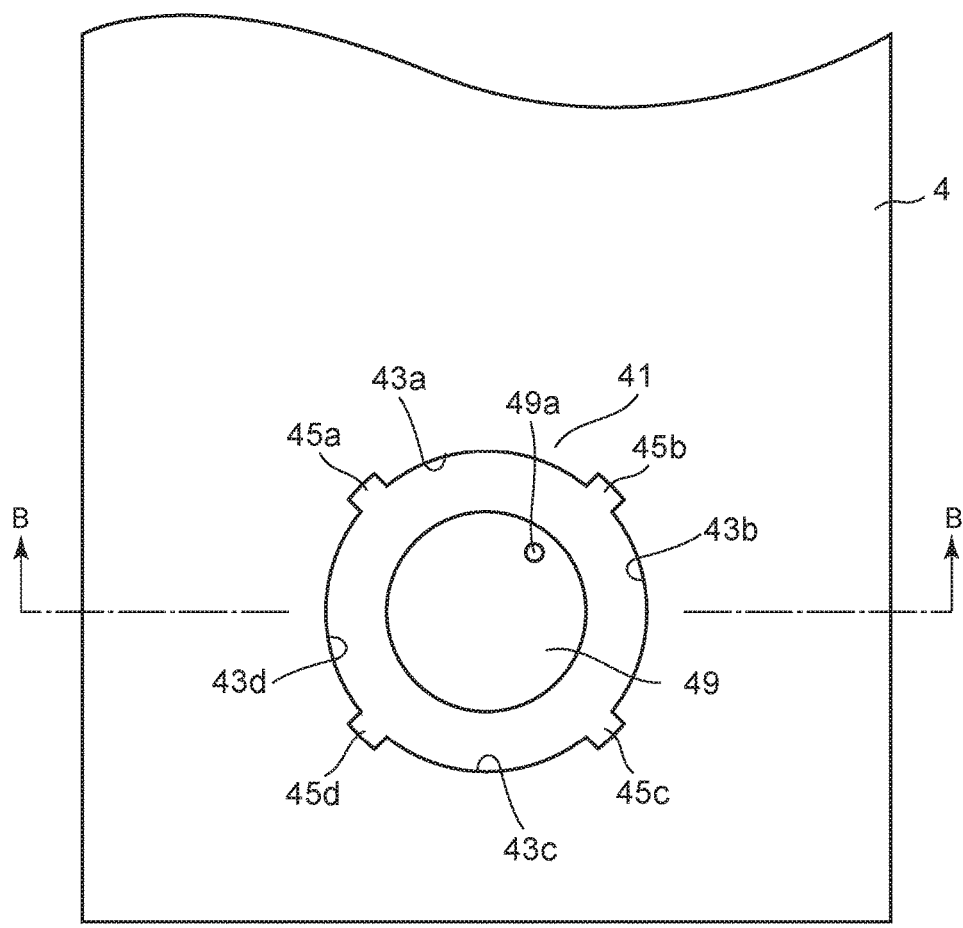
FIG. 13A is a plane view of the fitting recess 41 of the case 4.
Figure 13B:
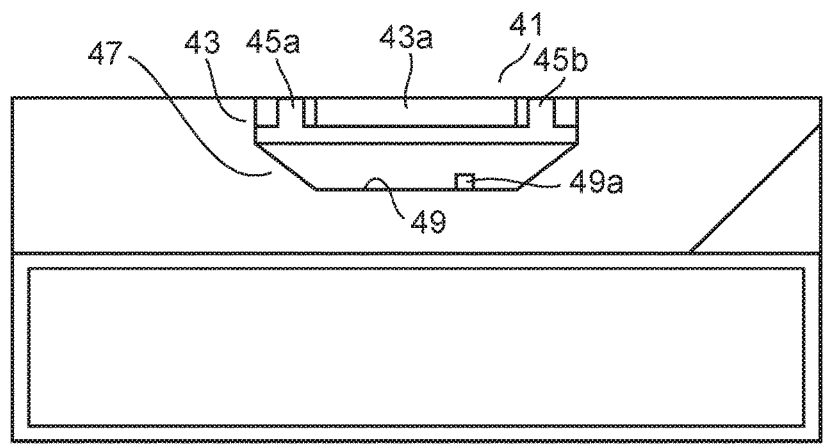
FIG. 13B is a cross sectional view thereof.

FIG. 13A is a plane view of the fitting recess 41 of the case 4. FIG. 13B is a cross sectional view thereof. The fitting recess 41 is composed of an upper portion 43 formed into a cylindrical hole and a lower portion 47 formed into an inverted truncated cone shaped hole. The upper portion 43 is composed of an upper side of the upper portion and a lower side of the upper portion. An inner wall of the upper side of the upper portion is divided by means of projecting holes 45a, 45b, 45c, 45d, and provided with four electrodes 43a, 43b, 43c, 43d formed thereon. For example, electrodes for a power supply line, a plus signal line, a minus signal line, and an earth line are provided. A lower side of the upper portion is formed to have the same diameter as the projecting holes 45a, 45b, 45c, 45d.

A diameter of the lower portion 47 is formed in a manner that the diameter becomes gradually smaller as it goes downward. A bottom surface 49 is provided with a pin 49a in a manner that the pin 49a projects out from the bottom surface 49.

Figure 14A:
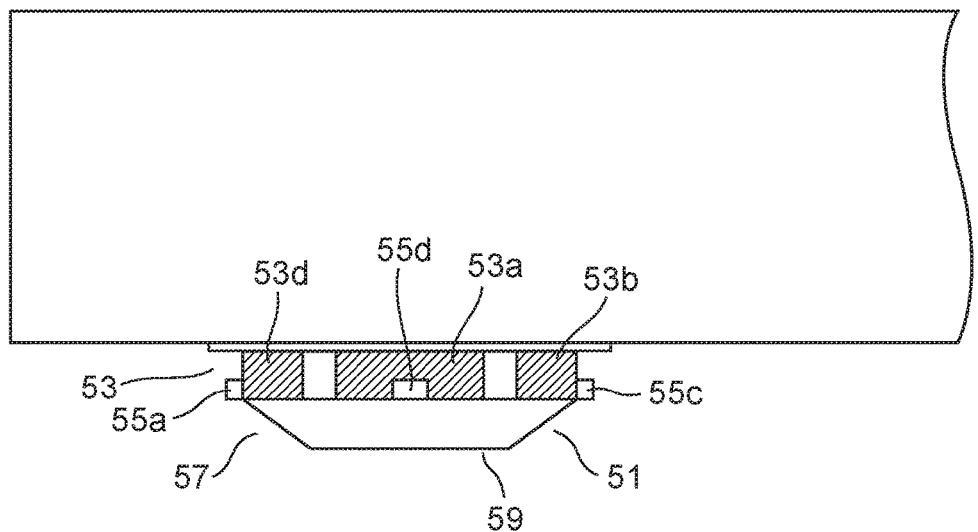
FIG. 14A is a side surface view of the fitting projection 51 of the attachment 50.
Figure 14B:
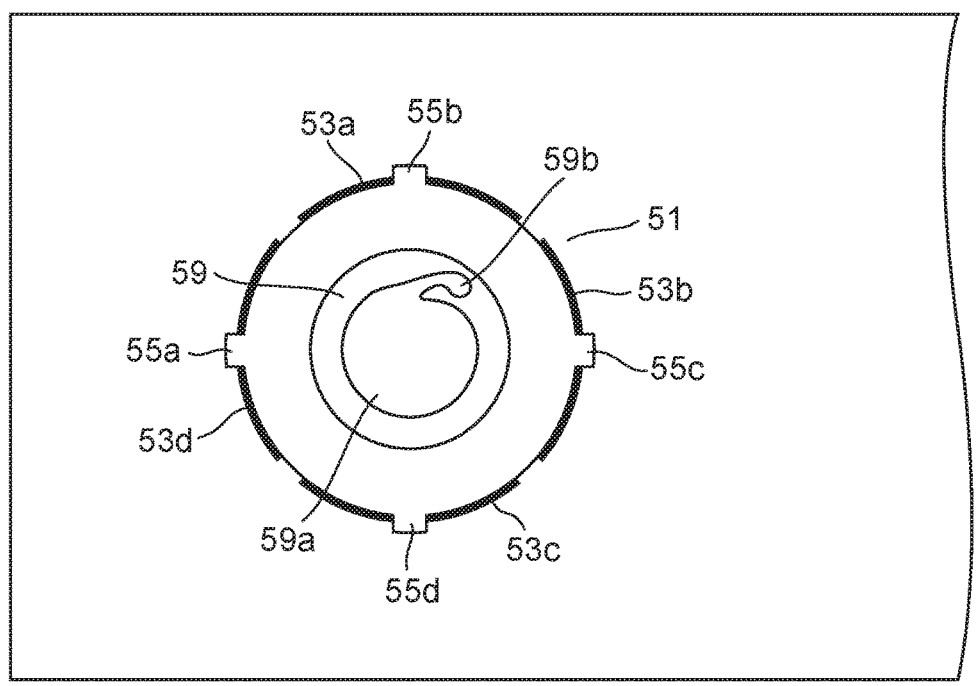
FIG. 14B illustrates the bottom surface thereof.

FIG. 14A is a side surface view of the fitting projection 51 of the attachment 50. FIG. 14B illustrates the bottom surface thereof. A shape of the fitting projection 51 corresponds to a shape of the fitting recess 41. The fitting projection 51 is composed of an upper portion 53 formed into a cylindrical shape and a lower portion 57 formed into an inverted truncated cone shape. An outer wall of the upper portion 53 is provided with four electrodes 53a, 53b, 53c, 53d formed thereon. For example, electrodes for a power supply line, a plus signal line, a minus signal line, and an earth line are provided. Further, at around a center of each electrode, projections 55a, 55b, 55c, 55d are provided. An end 59 of the lower portion 57 is provided with a circular hollow portion 59a. A depth of the hollow portion 59a is larger than a length of the pin 49a provided on the attachment 50. The hollow portion 59a is partially provided with an engagement portion 59b of which outer periphery swells out slightly.

Referring back to FIG. 12, the attachment 50 is inclined by 45 degrees, and the projections 55a, 55b, 55c, 55d of the fitting projection 51 of the attachment 50 are inserted into the corresponding projecting holes 45a, 45b, 45c, 45d of the case 4 in each corresponding manner. Accordingly, the projections 55a, 55b, 55c, 55d of the attachment 50 come to be inserted into the lower side of the upper portion of the case 4.

In this state, as shown in FIG. 12, the attachment 50 is rotated in an arrow F direction. Accordingly, the projections 55a, 55b, 55c, 55d of the attachment 50 are retained by the upper side of the upper portion and thus are prevented from being detached with ease. At the time, the pin 49a of the case 4 is firmly retained against the rotation direction because the pin 49a securely fits into the engagement portion 59b according to the rotation. Further, the electrodes 53a, 53b, 53c, 53d of the attachment 50 are brought into contact with the corresponding electrodes 43a, 43b, 43c, 43d of the case 4, thereby allowing establishment of electrical connection therebetween.

The other end of the attachment 50 is provided with the magnet 53, and the case 6 is also provided with the magnet 61. Thus, both are physically coupled together via a magnetic force.

In the present embodiment, one end of the attachment 50 is not easily detached even when it is pulled in a direction in which the attachment 50 is pulled away from the case 4, whereas the other end of the attachment 50 is easily detached since it is attached via the magnets. The neck band type wearable computer with the attachment 50 is placed to enclose the neck of a human being. Even in a case where this is pulled intentionally or by mistake, the other end of the attachment 50 is detached with ease, thereby being capable of securing safety.

In the above described embodiment, one end of the attachment 50 is fixed by the rotation, whereas the other end of the attachment 50 is attached via the magnets. This ensures secure fixing of one end against the force in the pulling away direction, whereas this allows easy detachment of the other end by the force in the pulling away direction. In the alternative structure, one end may be securely fixed by using a claw, etc., and the other end may be secured by a mere insertion. This also makes it possible to realize the above described purpose.

3. Other Example of Structure of Electronic Device

Figure 15A:
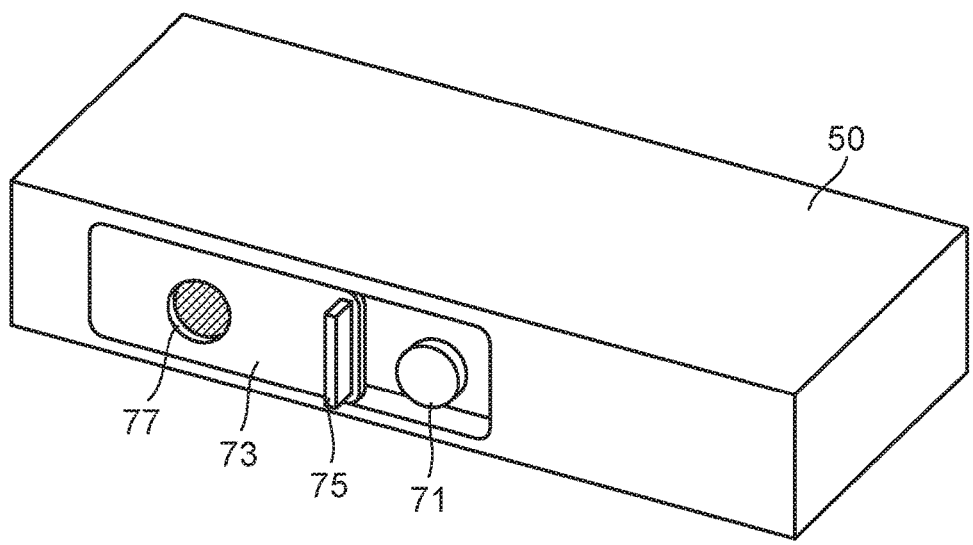
FIGS. 15A and 15B illustrate an outer appearance of the attachment 50 provided therein with a camera.

FIG. 15A illustrates an outer appearance of the attachment 50 provided therein with a camera. A lens 71 of the camera is provided on a side surface. A slidable cover 73 is provided in a manner that the cover 73 can cover the lens 71 of the camera. The cover 73 is provided with a projection 75 for sliding and a display hole 77. FIG. 15A illustrates a state where the cover 73 is opened to expose the lens 71, i.e., a state where the camera is ready for capturing an image. At the time, a display (e.g., a red color) for indicating that the camera is ready for image capturing can be viewed through the display hole 77.

Figure 15B:
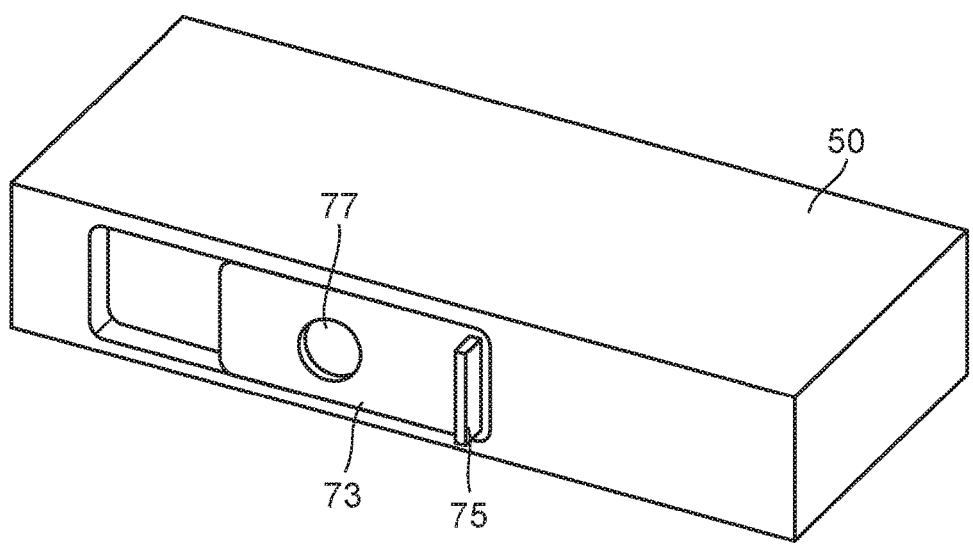

A state where the cover 73 is slid to close the lens 71 is shown in FIG. 15B. At the time, a display (e.g., a white color) for indicating that the camera is not ready for image capturing can be viewed through the display hole 77.

According to the embodiment, a state of being ready for image capturing and a state of not being ready for image capturing can be discriminatively displayed directly in association with the physical operation of covering/exposing the lens. The display is not performed by electrical treatment but by means of a physical display mechanism. Therefore, it is impossible to provide a display indicating as if a camera is in a state of not being ready for image capturing although the camera is actually in a state of being ready for image capturing. This allows a person other than the wearer to make accurate determination whether or not the camera is in a state of being ready for image capturing.

Figure 16:
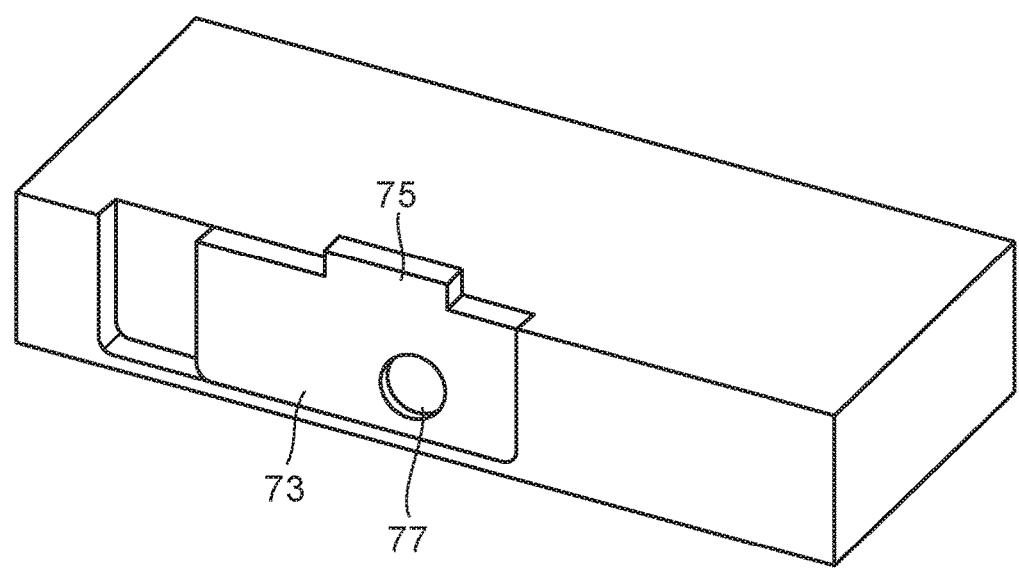
FIG. 16 illustrates an outer appearance of the attachment 50 provided therein with a camera.

In the above described embodiment, the projection 75 for sliding is provided on a front surface. Alternatively, as shown in FIG. 16, the projection 75 may be provided on the upper portion.

Further, in the above described embodiment, a camera was exemplified for the sake of description, this mechanism is applicable to all devices which requires confirmation on presence or absence of operation.

Further, in the above described embodiment, the camera provided on the attachment 50 of the neck band type computer was described. The mechanism is, however, also applicable to a camera provided on a main body of a neck band type computer or a camera provided on a main body or an attachment of any other wearable computer.

Figure 17:
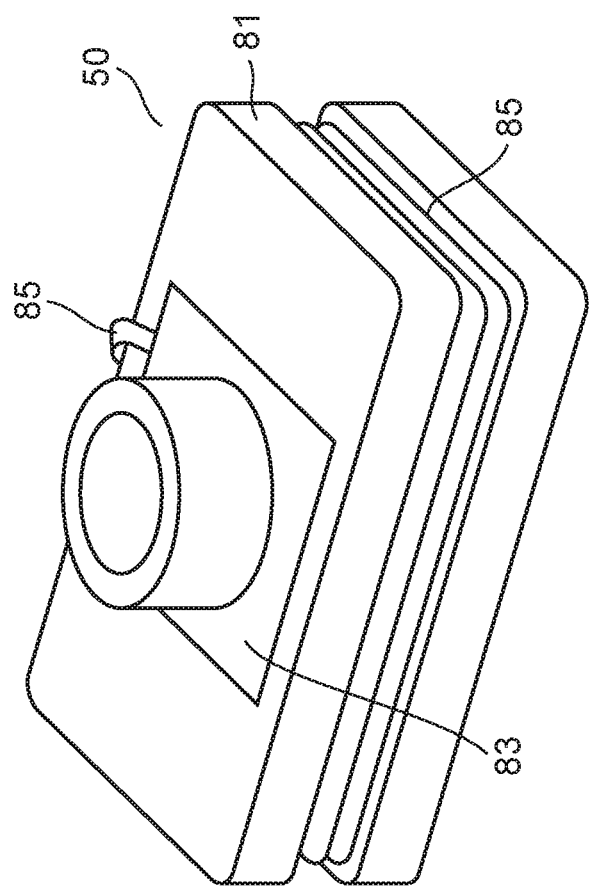
FIG. 17 illustrates the attachment 50 according to the other embodiment.

FIG. 17 illustrates the attachment 50 according to the other embodiment. An attachment case 81 is provided with a camera 83 mounted thereon. A signal and current flow of the camera 83 are introduced to the attachment case 81 via a code 85. The fitting projection 51 identical to what illustrated in FIG. 14 is provided on a back surface of the attachment case 81. With the fitting projection 51, the attachment 50 can be attached to the case 4. The camera 83 will be connected to a computer of the case 4 or a battery of the case 6 via the code 8 and the fitting projection 51. Accordingly, the camera 83 can be mounted on a front surface of the case 4.

Figure 18:
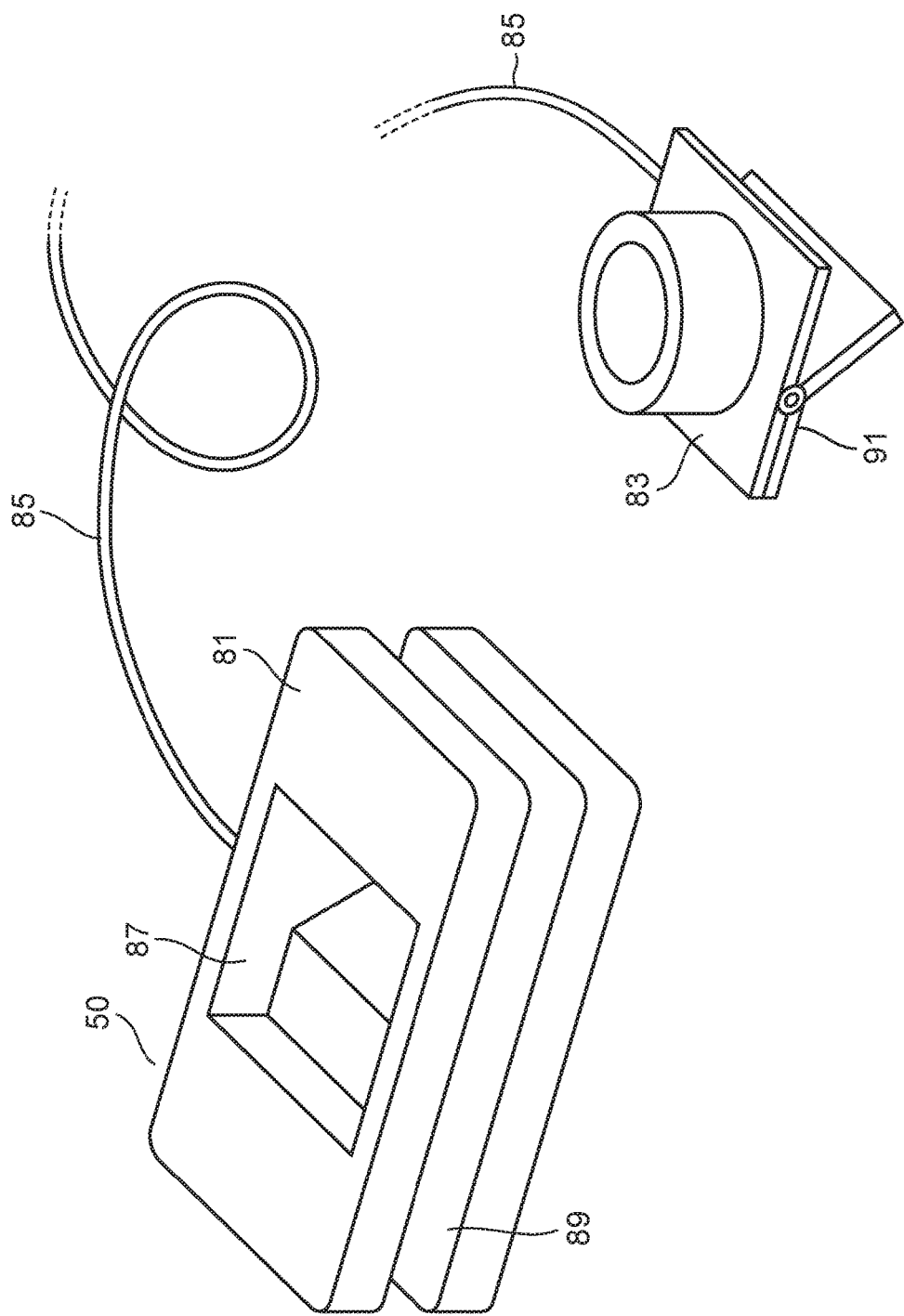
FIG. 18 illustrates a status in that the camera 83 is detached from a housing recess 87 of the attachment case 81.

In the attachment 50, as illustrated in FIG. 18, the camera 83 can be detached from a housing recess 87 of the attachment case 81. A side surface of the attachment case 81 is provided with a code winding recess 89 around which the code 85 is wound for storage. When the camera 83 is detached, the code 85 wound around the code winding recess 89 can be pulled out for use. Further, the camera 83 is provided with a clip 91. The camera can be fixed to an object by clipping the object with tips of the clip 91.

Accordingly, the camera 83 can be used while the camera 83 is housed in the attachment case 81 attached to the case 4, and the camera 83 also can be used, while the camera 83 is detached from the attachment case 81, by, for example, attaching it to a collar of clothes via the clip 91.

Figure 19:
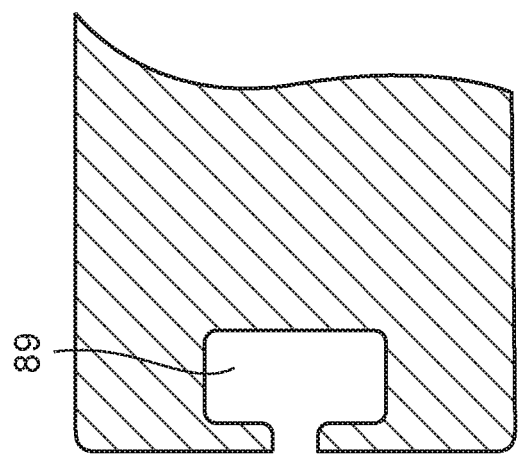
FIG. 19 illustrates a cross sectional view of the code winding recess 89.

Incidentally, as illustrated in a cross sectional view of FIG. 19, with a narrow inlet of the code winding recess 89, the code 85 can be firmly retained.

Figure 20:
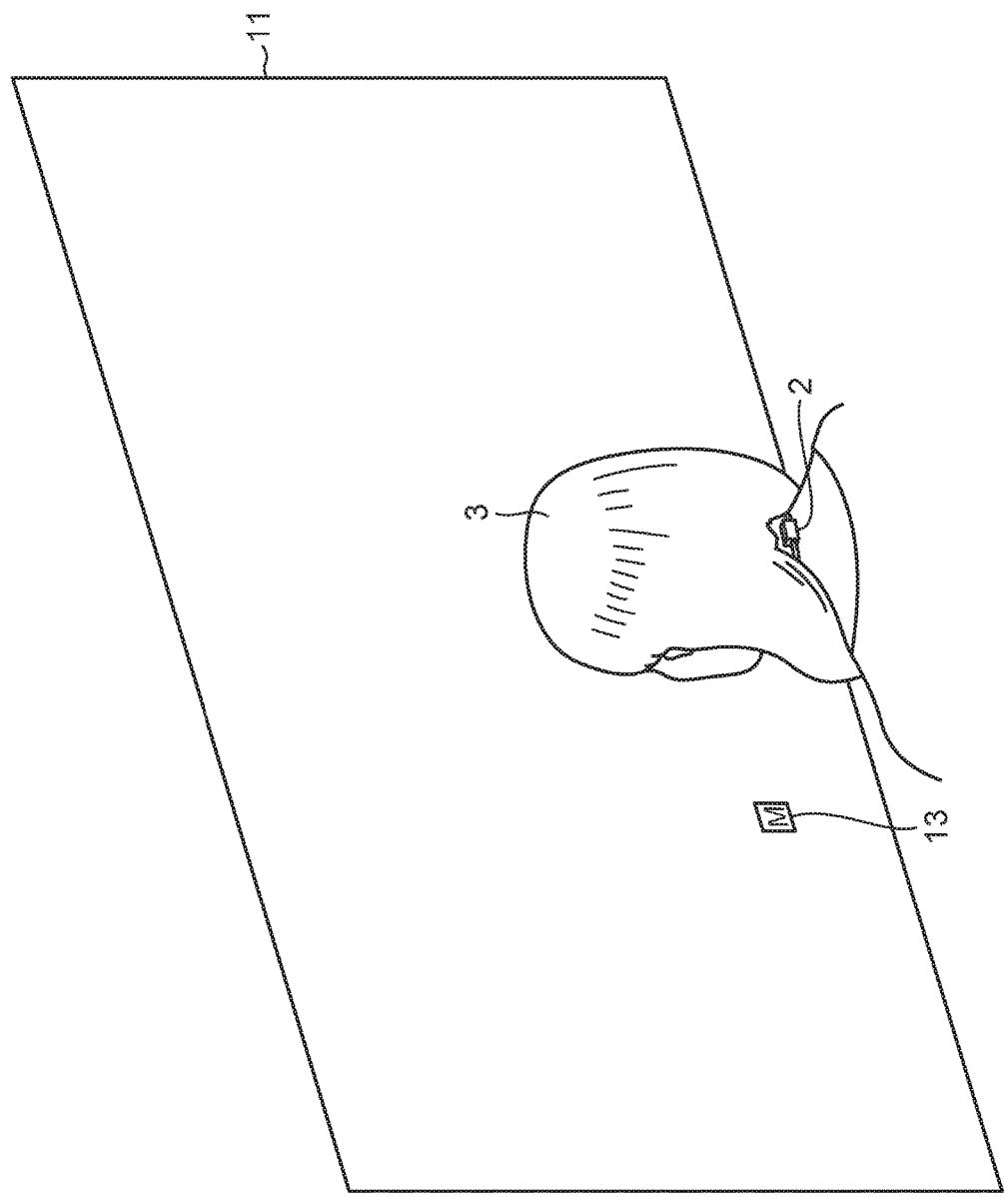
FIG. 20 illustrates an exemplary use in a case where the attachment 50 is provided with a laser projector.

FIG. 20 illustrates an exemplary use in a case where the attachment 50 is provided with a laser projector. A user 3 who wears the neck band type wearable computer 2 performs a display onto a wall 11 as an object by means of a laser projector (not shown). The wall 11 is provided with a marker 13 for display.

Figure 21:
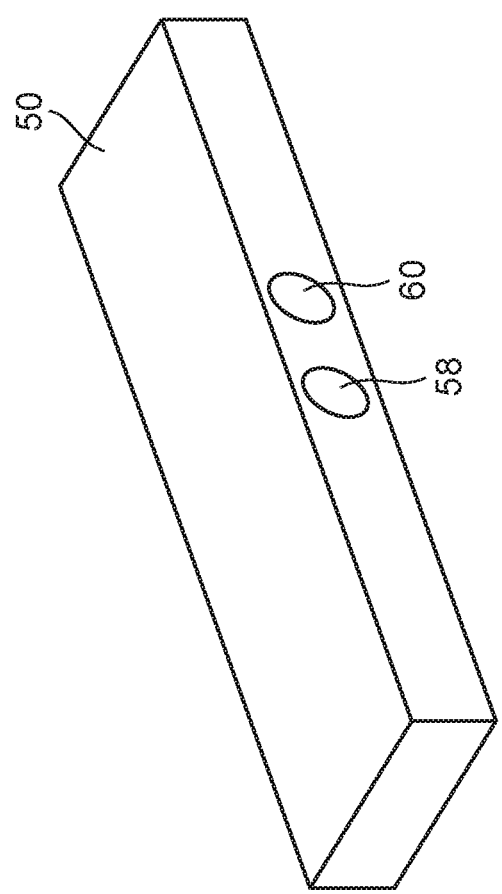
FIG. 21 illustrates an attachment 50 built in a laser projector 58 and a camera 60.

As illustrated in FIG. 21, in this embodiment, a laser projector 58 and a camera 60 are built in the attachment 50. A projection area of the laser projector 58 matches an imaging range of the camera 60. Signals from the laser projector 58 and the camera 60 are transferred to the CPU 30 (see, FIG. 2) within the case 4 via connectors (e.g., the fitting recess 41 and the fitting projection 51 of FIG. 11).

Figure 22:
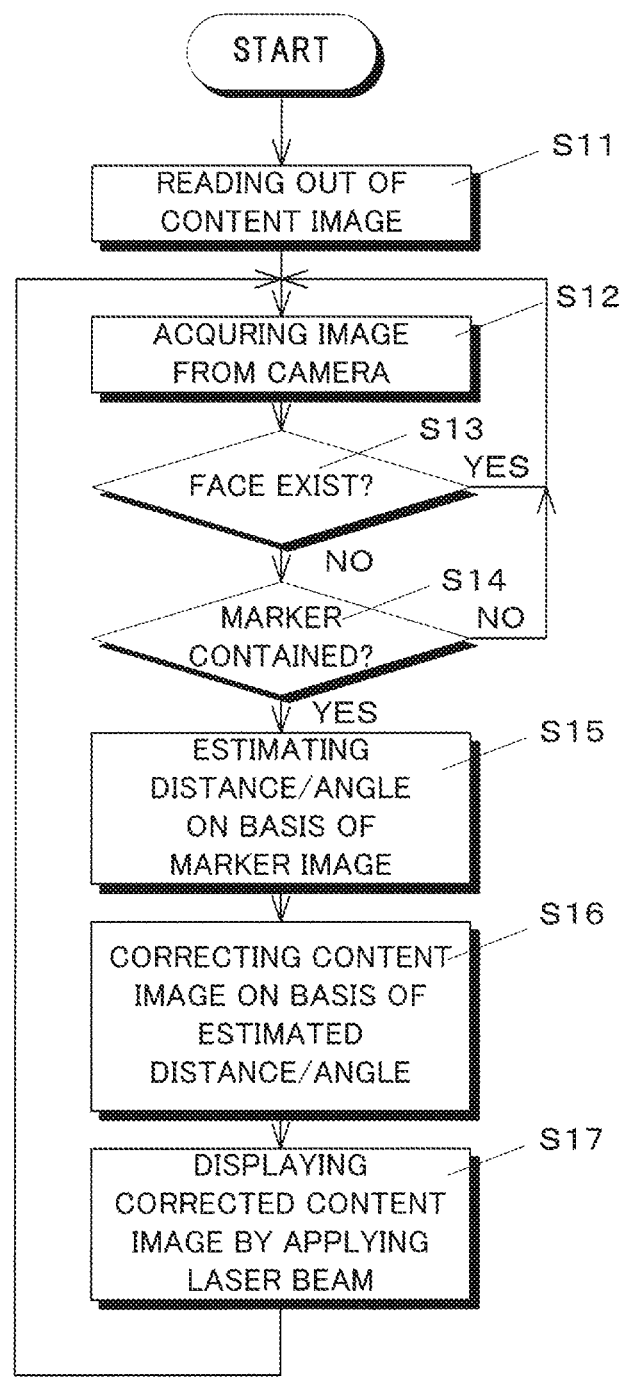
FIG. 22 illustrates a flow chart of the control program.

The CPU 30 controls the laser projector 58 to display an image according to a control program stored in the flash memory 34. A flow chart of the control program is shown in FIG. 22.

The CPU 30 reads out a content image to be displayed from the flash memory 34 via user's selection operation (Step S11). Subsequently, the CPU 30 acquires an image captured by the camera 60 (Step S12).

The CPU 30 determines whether or not there is a human face in thus acquired image (Step S13). The face recognition in an image can be performed by using a general face recognition technology. When the CPU 30 finds out a face in the image, the CPU 30 controls the laser projector 58 not to apply a laser beam. Instead, the CPU 30 causes the processing to return to step S12 and repeats acquisition of an image from the camera and determination of presence/absence of a face. This is because, when there is a face in an image, if a laser beam is applied by the laser projector 58 in this state, the laser beam will be applied to the face. Some countries prohibit application of a laser beam to a face. Therefore, this function is effective in such countries.

If there is no face in the image, the CPU 30 determines whether or not the marker 13 is contained in the image (Step S14). If no marker 13 is contained, the CPU 30 repeats steps on and after Step 12. When the CPU 30 confirms the marker 13, the CPU 30 estimates a distance and an angle to the wall 11 as an object on the basis of the image of the marker 13 (Step S15). A size and a shape (a square in this embodiment) of the marker 13 are known. Therefore, it is possible to estimate the distance and the angle on the basis of a degree of change of size and shape of the marker 13.

Figure 23A:
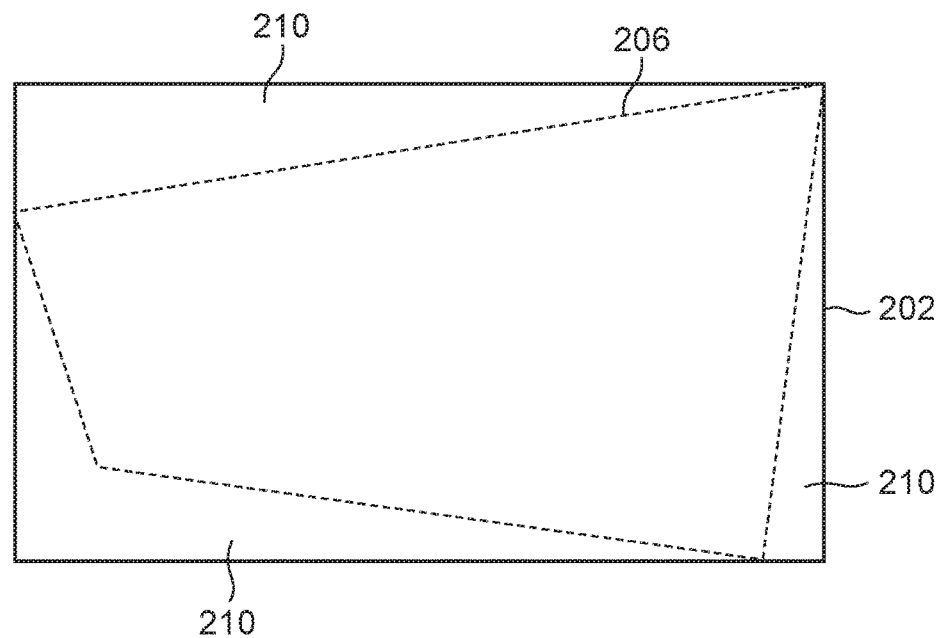
FIGS. 23A and 23B illustrate an image of an original image 202 and a deformed square image 204 projected.
Figure 23B:
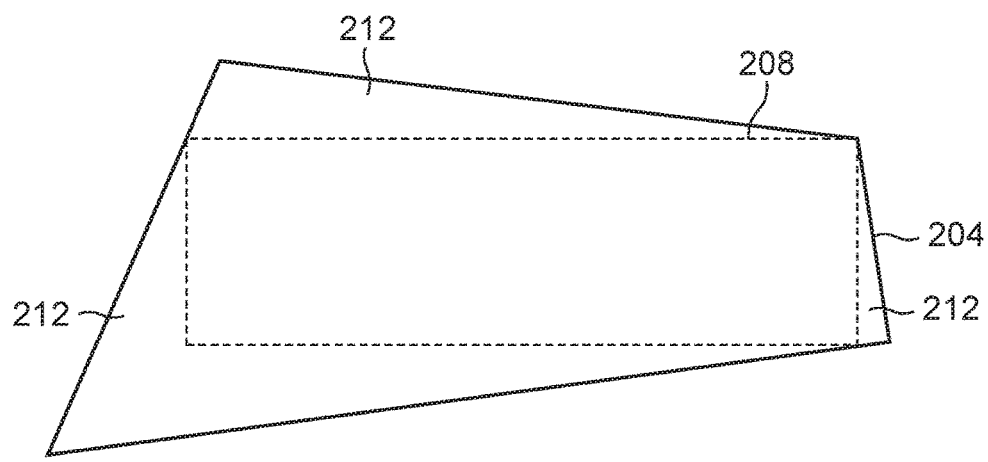

For example, when an image of an original image 202 having a rectangular shape (FIG. 23A) is projected by means of the laser projector 58, a deformed square image 204 is displayed as shown in FIG. 23B in accordance with a distance and an angle to the wall 11. To solve the problem, the CPU 30 makes a correction of the original image in a manner that, by assuming a rectangular shape 208 inscribed inside the deformed square image 204 (laser beam applicable area) as shown in FIG. 23B, the image is displayed on the rectangular shape 208 (Step S16). Thus corrected original image 206 is displayed as shown in FIG. 23A.

The CPU 30 controls the laser projector 58 to display thus corrected original image 206 (Step S17). In the present embodiment, the CPU 30 controls the laser projector 58 not to apply a laser beam to an outside 210 of a frame of thus corrected original image 206.

With the above described structure, regardless of a distance and an angle to the wall 11 as an object, a content image to be displayed can be projected without deformation thereof.

Further, in the present embodiment, if there is a human face in an image captured by a camera, the CPU 30 controls not to apply a laser beam. Therefore, possibility of applying a laser beam onto a human face can be eliminated.

Incidentally, with the above described structure, if there is a human face in the captured image, no laser beam will be applied. To the contrary, if there is no human face in an area of the rectangular shape 208 of FIG. 23B, a laser beam may be applied. This is because, in this case, even when there is a human face in an outer area 212, display can be performed without applying a laser beam onto the human face.

Figure 24:
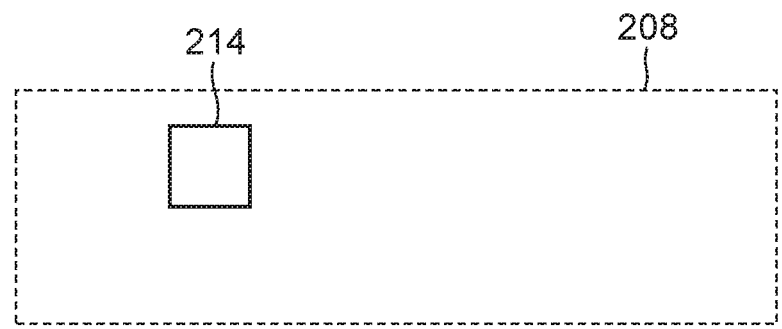
FIG. 24 illustrates a status where the CPU 30 may control not to apply a laser beam in an area 214 where a human face is recognized in the displayed rectangular shape 208.

Further, in the above described structure, a laser beam is not applied to a content image in its entirety if there is a human face in the content image. As shown in FIG. 24, the CPU 30 may control not to apply a laser beam in an area 214 where a human face is recognized in the displayed rectangular shape 208. This enables display of a content image except for a human face. Further, the CPU 30 may control not to apply a laser beam only to an area around eyes but not to the area 214 where a human face is recognized.

In the above described embodiment, the marker 13 is employed. Alternatively, by specifying a featured image (four corners of an object assumed as having a square shape, etc.) in the captured image, thus specified image may be used instead of the marker 13.

4. Example of Use

Figure 25:
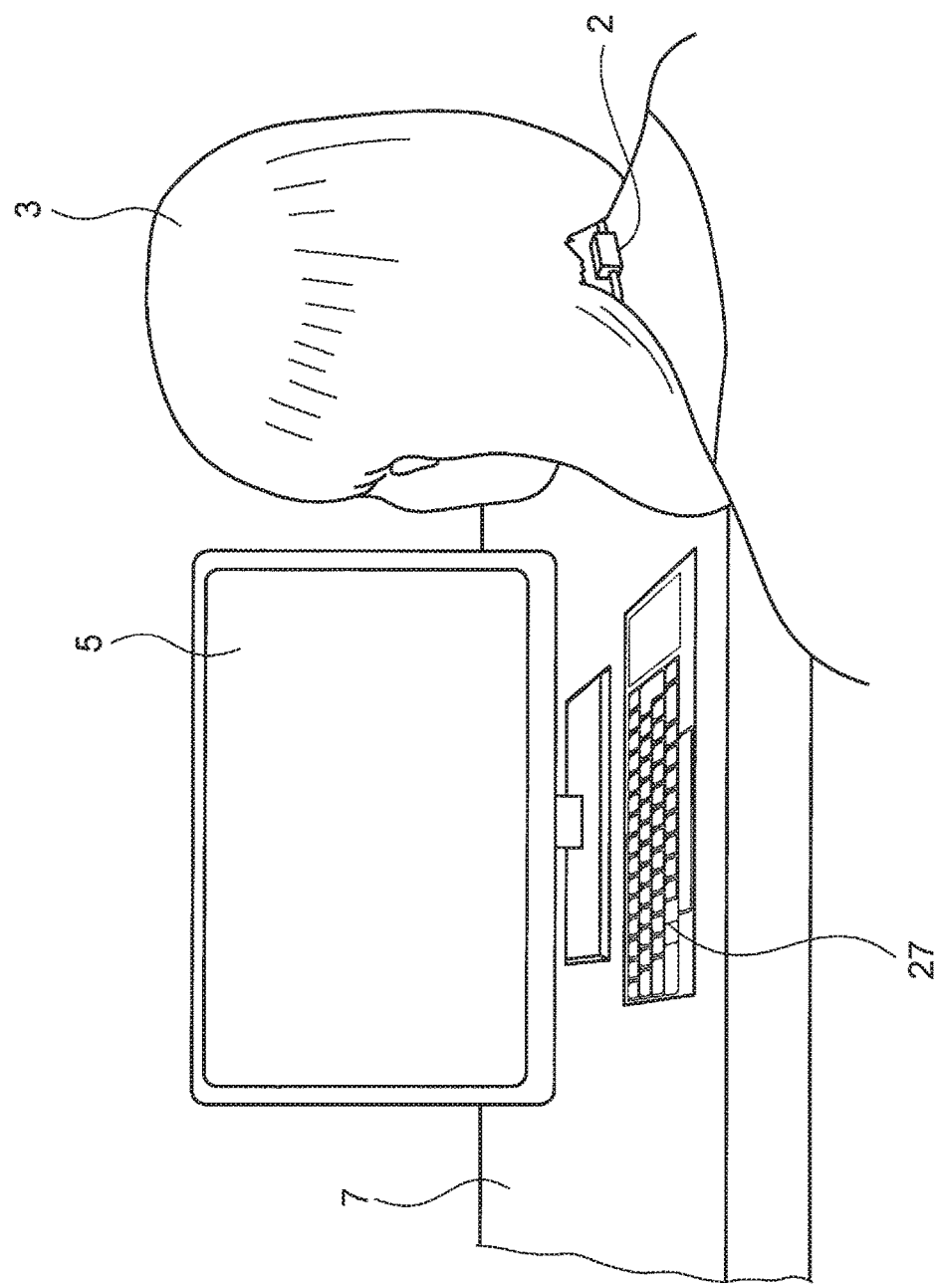
FIG. 25 illustrates an example of use of the neck band type computer 2.

FIG. 25 illustrates an example of use of the neck band type wearable computer 2. The user 3 wearing the neck band type wearable computer 2 is sitting in front of a display 5 set on a desk 7. The display 5 is equipped with a short-range communication circuit (e.g., Bluetooth communication circuit). A short-range communication circuit 40 of the neck band type wearable computer 2 communicates with the display 5 and outputs a display signal.

Figure 26:
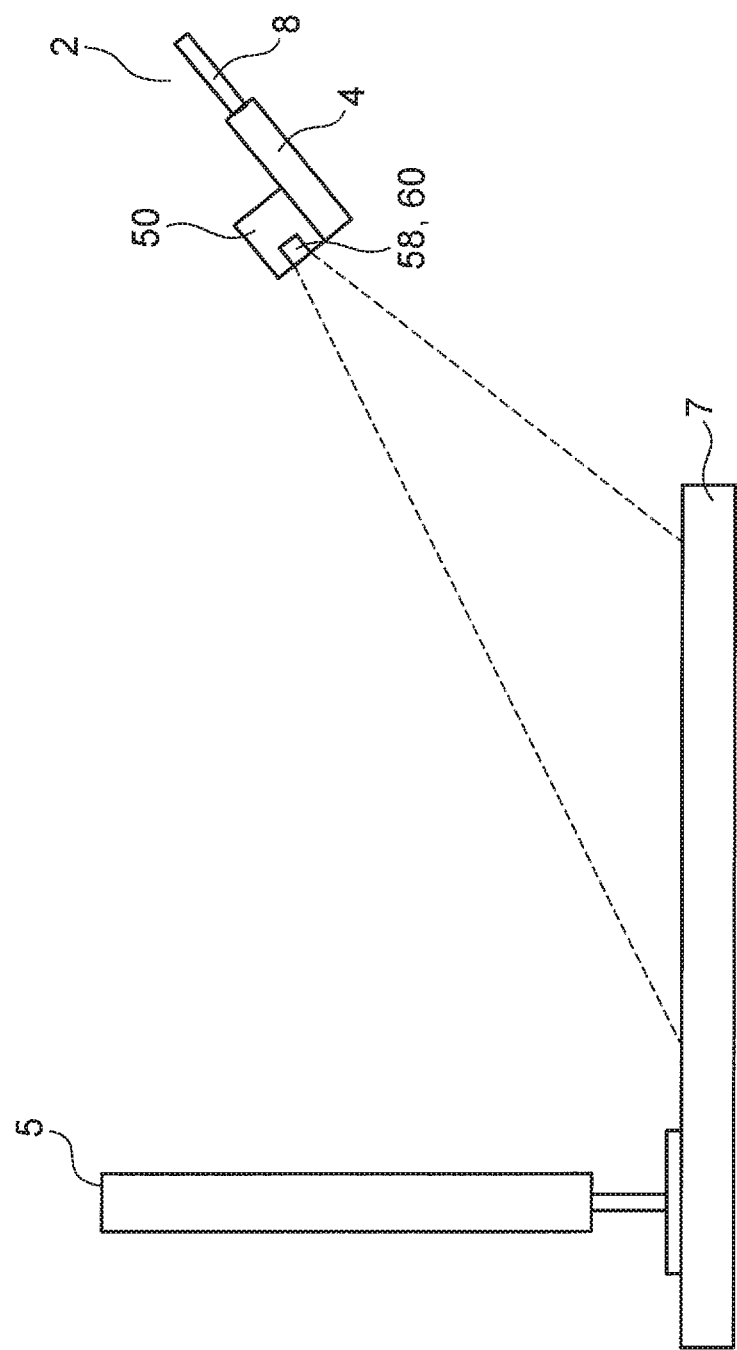
FIG. 26 illustrates display of a keyboard projected by a laser projector 58.
Figure 27:
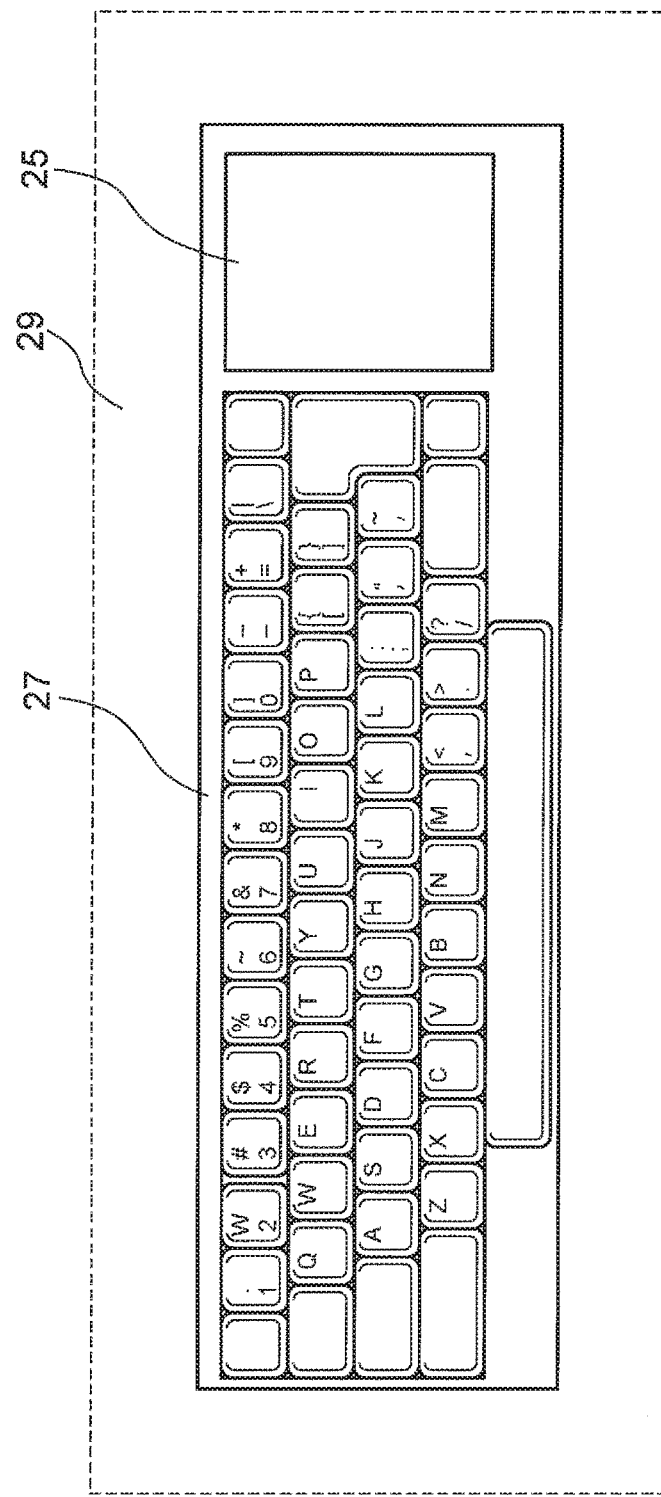
FIG. 27 is an example of a keyboard 27 projected by the laser projector 58.

In the example of FIG. 25, the attachment 50 equipped with a laser projector and a camera is worn (not shown). As illustrated in FIG. 26, the laser projector 58 displays a keyboard on the desk 7. A keyboard 27 displayed on the desk 7 by means of the laser projector 58 is illustrated in FIG. 27. In the present embodiment, a projectable area projectable by the laser projector 58 is an area 29 indicated by a dotted line. The keyboard 27 is projected within a sufficiently large projectable area.

Movement of a finger of the user on thus displayed keyboard 27 is detected by the camera 60 to determine which key is depressed. Incidentally, an area 25 is an area for moving a mouse cursor when movement of a finger is detected.

Incidentally, since the laser projector 58 is worn by the user 3, the projected image moves following movement of the user. This makes the user hard to use it. The CPU 30 controls to fix the display of the keyboard 27 at a predetermined position in the following manner.

Figure 28:
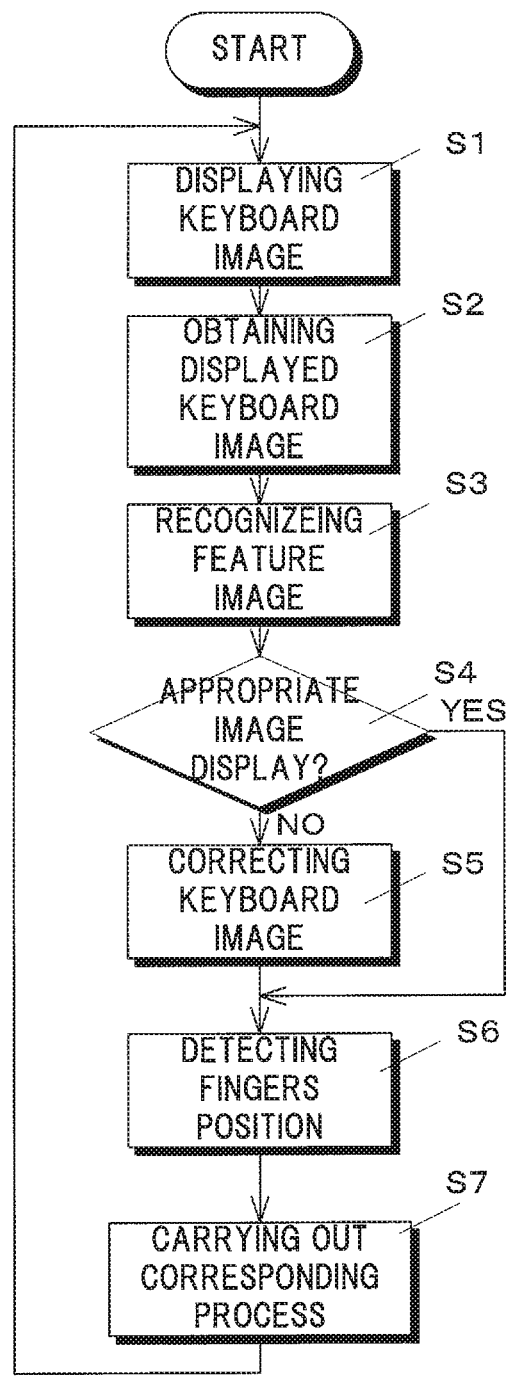
FIG. 28 is a flow chart of a display program.

A flow chart of a keyboard input program is illustrated in FIG. 28. Initially, in step S1, the CPU 30 transfers keyboard image data that is preliminary prepared to the laser projector 58 to cause the projector to project a keyboard on the desk 7 (Step S1). Then, the CPU 30 obtains an image of the keyboard projected by the camera 60 (Step S2). Subsequently, the CPU 30 specifies a featured image from thus captured keyboard image (images of projected keyboard and portions of desk around the keyboard) (Step S3). A featured image that is not contained in the keyboard image data (e.g., design, scratches, etc. on a surface of the desk 7) is recorded together with a position (relative positional relationship with the keyboard) thereof as a featured image.

Then, the CPU 30 determines whether or not the keyboard is correctly projected (Step S4). In the present embodiment, the keyboard is displayed by a predetermined size (e.g., the size is determined by a ratio of the keyboard occupying in the captured image) as a rectangular shape having a predetermined aspect ratio. Further, the CPU 30 recognizes that a display in a case where the keyboard has a predetermined positional relationship with respect to the featured image is correct. For example, in a case where the keyboard has an outer appearance of trapezoid or rhombus, it is not considered as a correct display. Further, also, in a case where the positional relationship with respect to the featured image does not match, it is not considered as a correct display.

Figure 29A:
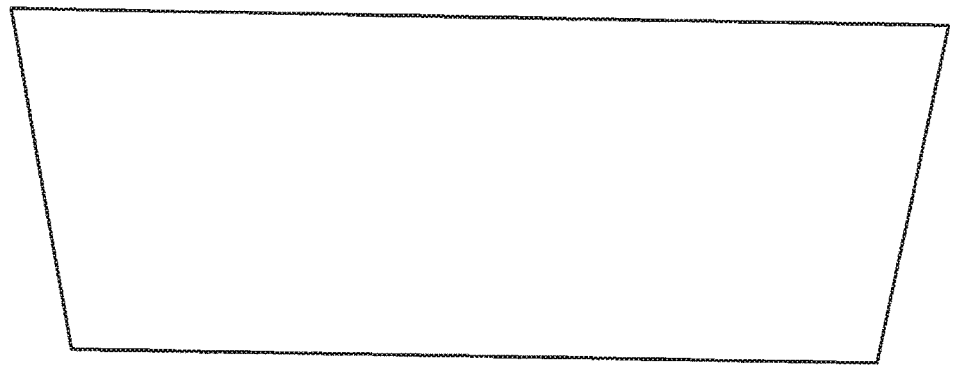
FIGS. 29a and 29b illustrate correction of display data.
Figure 30A:
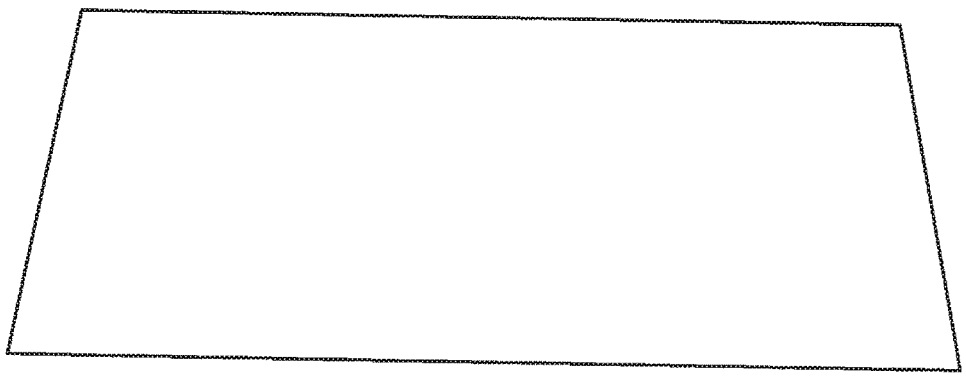
FIGS. 30a and 30b illustrates correction of display data.

When the CPU 30 determines that the display is not correct, the CPU 30 corrects the keyboard image data for projection (Step S5). For example, if the captured keyboard image is deformed to have a trapezoid shape as shown in FIG. 29A, the CPU 30 corrects the keyboard image for projection in a manner that a width becomes narrower as it goes upward and a width becomes wider as it goes downward. For example, the CPU 30 corrects data of the keyboard image for projection to keyboard image data as shown in FIG. 30A. As a result, a rectangular shaped keyboard will be displayed on the desk 7. Incidentally, the CPU 30 corrects data, at the time of correction, in a manner that the keyboard to be projected becomes a predetermined size. Therefore, a keyboard adjusted to have the predetermined size and rectangular shape is displayed on the desk 7.

Figure 29B:
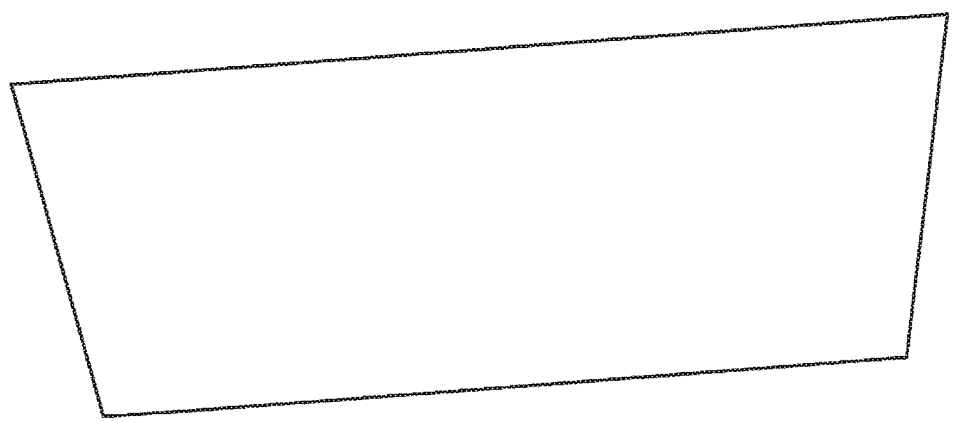
Figure 30B:
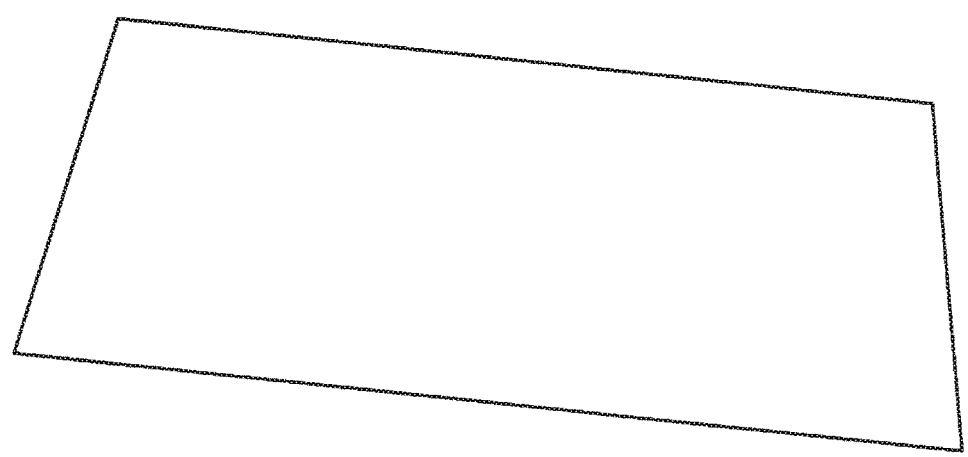

As shown in FIG. 29B, in a case where a captured keyboard image is inclined, the CPU 30 corrects keyboard image data in a manner that the inclination is amended as illustrated in FIG. 30B.

As described above, the CPU 30 corrects various kinds of deformation by correcting the keyboard image data, thereby projecting a rectangular shaped keyboard.

Further, the CPU 30 recognizes a featured image from the captured keyboard image to specify it. The CPU 30 corrects keyboard image data in a manner that the featured image and the projected keyboard have a positional relationship as initially recorded. In the present embodiment, as shown in FIG. 27, since the keyboard 27 is projected within the projectable area 29 with a sufficient margin, the above described adjustment can be performed.

Accordingly, a keyboard shaped into a predetermined sized rectangular shape will be fixedly displayed at a predetermined position on the desk 7 regardless of movement of the user 3.

Then, the CPU 30 specifies a finger of the user 3 in the captured image. The CPU 30 can specify the finger by finding out a round slender tip (Step S6). Subsequently, the CPU 30 determines on which key of the keyboard the specified finger resides. The CPU 30 performs input processing as the specified key was depressed (Step S7).

In a case where a finger is on the area 25, the CPU 30 acquires data of a position of the finger this time (Step S6), determines a moving direction and moving speed of a cursor on the basis of a previous position of the finger and the present position of the finger, and causes the cursor to move (Step S7).

By repeating the above described steps, input processing can be achieved. As described above, in the present embodiment, the neck band type wearable computer serves as a desktop computer if only with a display 5.

Incidentally, in the above described embodiment, the projector 58 and the camera 60 are connected via the fitting connectors 38. They may be connected via the connectors for external device connection 36 instead. Alternatively, they may be connected via a short-range communication circuit. Further, the display 5 is connected via a short-range communication circuit. It may be connected via the connectors for external device connection 36 instead.

Figure 31:
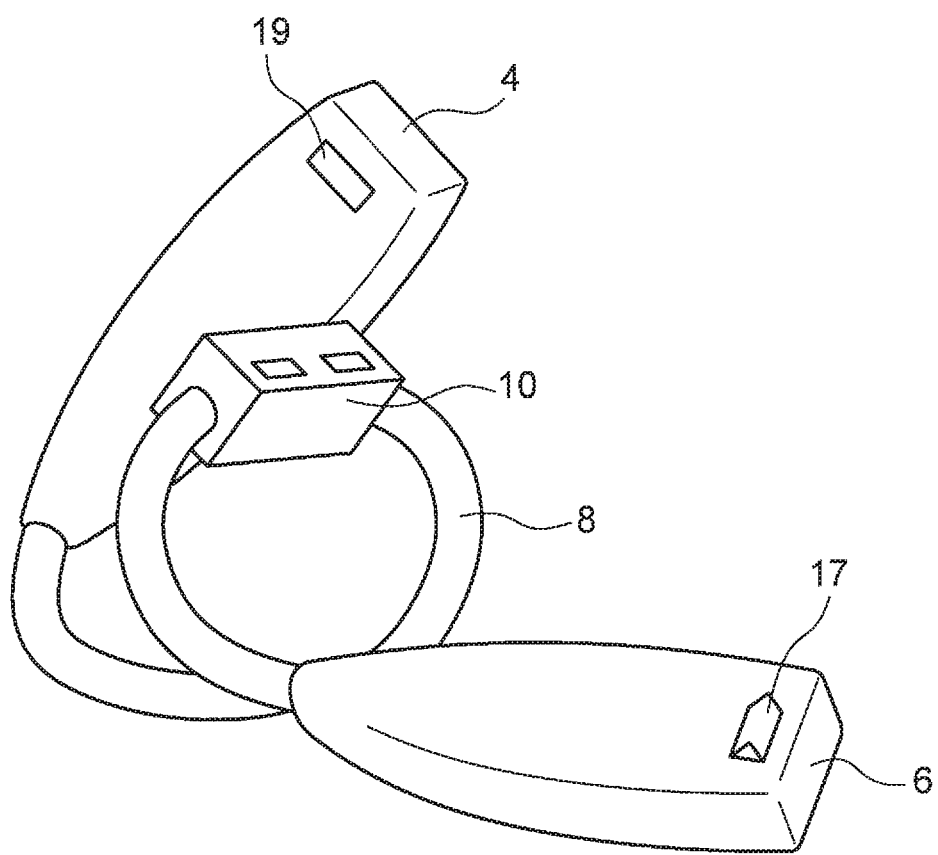
FIG. 31 illustrates another example of a wearable computer.

5. Others (1) In the above described embodiment, the wearable computer 2 used by wearing it around the neck was described. The wearable computer 2, having the same structure, may be used by winding it around a portion of a human body, e.g., the wrist and the ankle, as shown in FIG. 31. In FIG. 31, the cases 4, 6 are provided with engagement members 17, 19 for mutual engagement. Engagement of the members allows the cases to be fixed each other.

Alternatively, the cases 4, 6 may be engaged with each other via magnets provided on the cases 4, 6.

Figure 32:
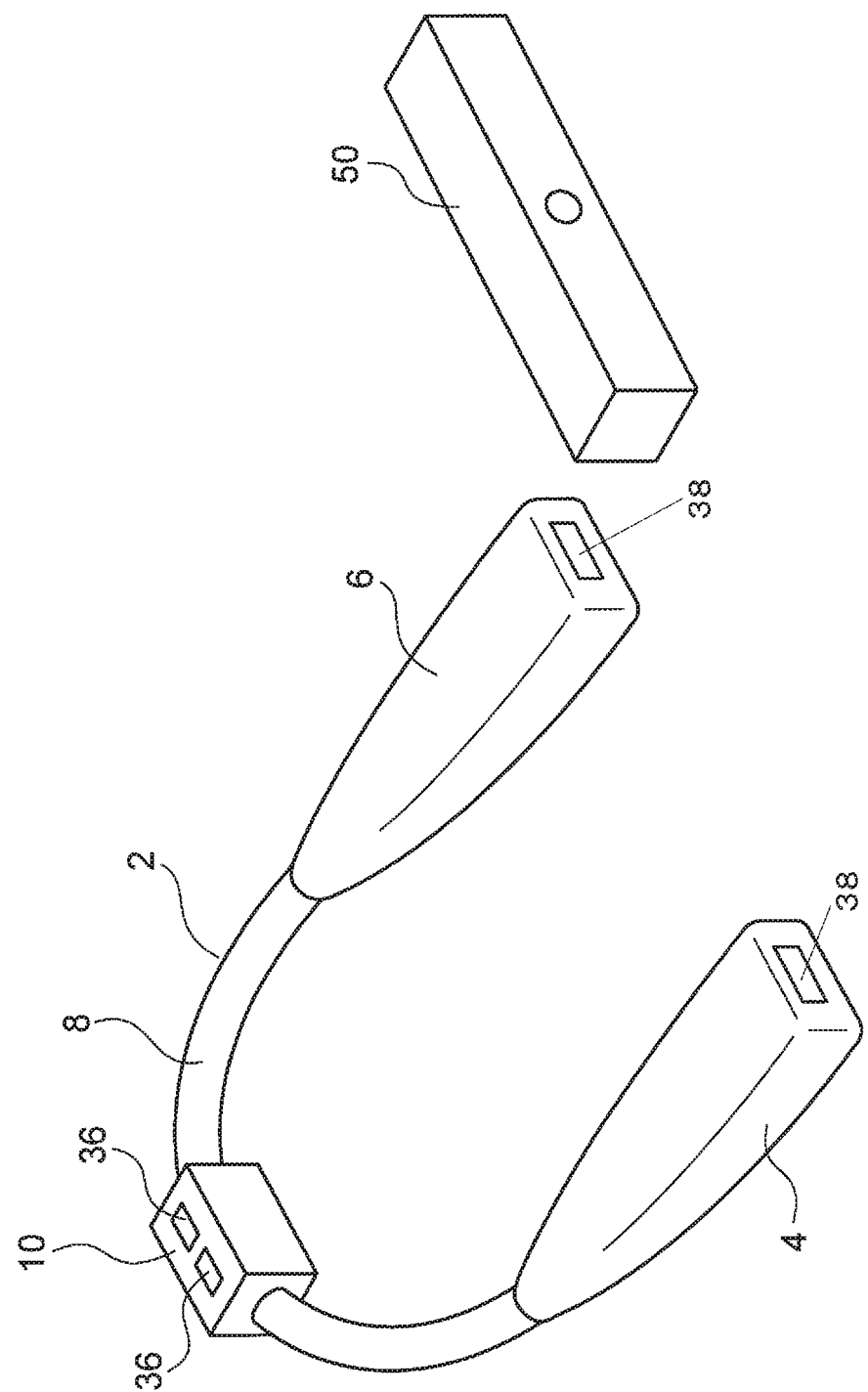
FIG. 32 illustrates a fitting connectors 38 provided in both of the top surfaces and the front surfaces.

(2) In the above described embodiment, the fitting connectors 38 and the fitting recess 41 are provided in top surfaces of the cases 4, 6 as shown in FIG. 1 and FIG. 11. They may be provided in front surfaces of the cases 4, 6 as shown in FIG. 32 (the same applies to FIG. 11). Alternatively, they may be provided in both of the top surfaces and the front surfaces.

(3) In the above described embodiment, a double winding coil is used as the coil 80. A single winding coil may also be used instead. Even in this case, a bending state maintaining effect can be produced by tight contact/stretching of the tube 90.

Further, a multi-winding coil coiled more than three times may be used instead of the double winding coil. Even in this case, it is preferable that the coil is made in a manner that a wire having a round cross section and a wire having a triangular cross section are wound such that the neighboring wires contact each other.

In the above described embodiment, the coil 80 is composed of a wire having a round cross section and a wire having a triangular cross section. Instead thereof, a coil composed of a wire having a round cross section and a wire having a cross section of multangular shape more than square shape may be used. Alternatively, a wire having an angular (trapezoid, parallelogram, etc.) cross section may be used.

In the above described embodiment, a force in a direction in which the tube 90 compresses the coil 80 is applied. Alternatively, biasing means (flexible member, spring material, etc.) which is fixed to both ends of the coil 80 and biased to a shrinking direction may be provided.

(4) In the above described embodiment, a force in a direction in which the tube 90 compresses the coil 80 is applied. Alternatively, instead of applying the compression force, the coil 80 may be used as the flexible arm 8.

(5) In the above described embodiment, the flexible arm 8 is composed of the coil 80 and the tube 90. Alternatively, the flexible arm 8 may be composed of a hollow plastic member or a solid plastic member.

Figure 33A:
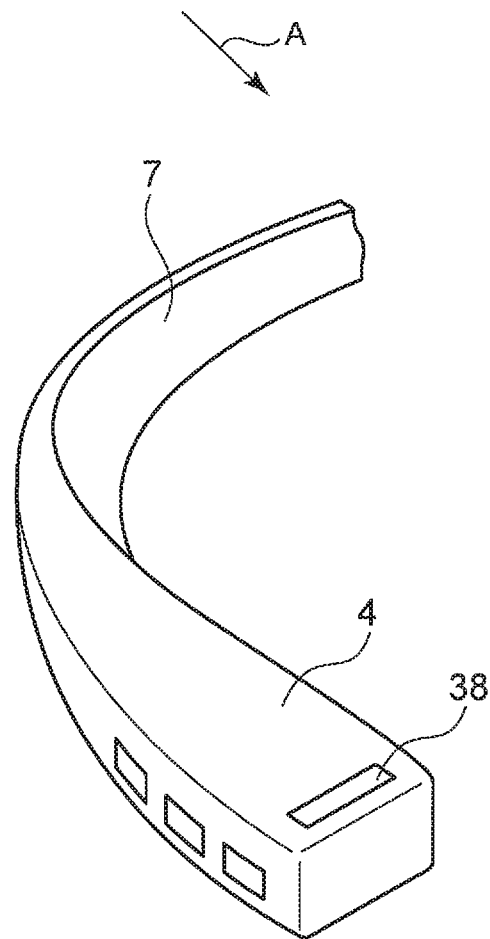
FIGS. 33a and 33b illustrates further another example of the wearable computer.
Figure 34:
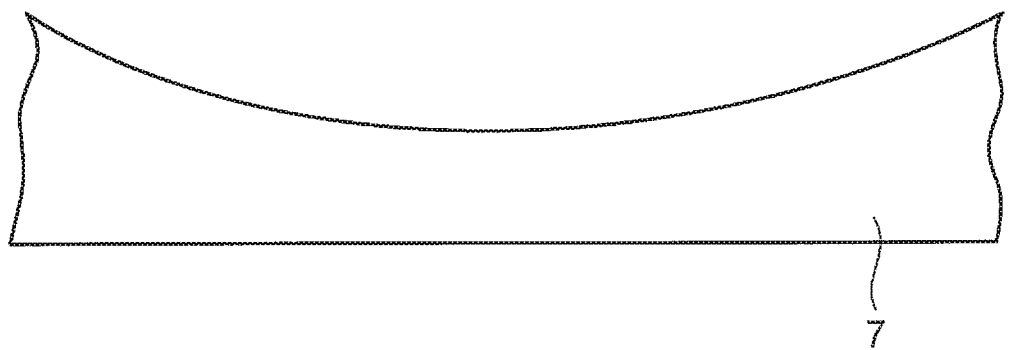
FIG. 34 illustrates a recess to be fit on the back of the neck.

(6) In the above described embodiment, the wearable computer 2 is composed of the cases 4, 6, the connector case 10, and the flexible arm 8. Alternatively, they may be formed into one piece of plastic member. An example having such structure is illustrated in FIG. 33A. The arm 7 is provided continuously from the case 4. The arm 7 is formed into a thin plate shape. The arm 7 is formed into a shape that a portion of contacting the back of the neck extends long in up-and-down direction and is thin in front-to-rear direction. Further, when viewed from the back (from an arrow A direction in FIG. 33A), an upper central portion is formed into a recess shape as shown in FIG. 34. This allows a comfortable fitting to the back of the neck of the user 3.

Figure 33B:
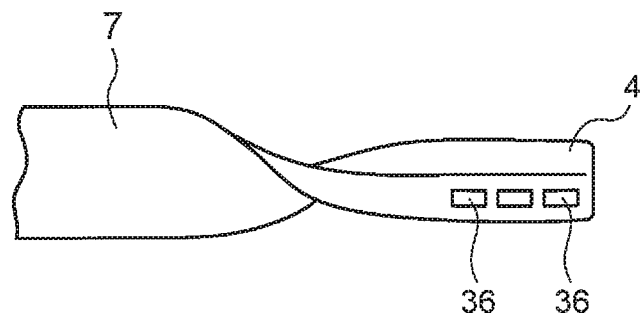

On the other hand, the cases 4, 6 are formed thinly perpendicular to the arm 7 for the purpose of achieving stability on the chest of the user 3. To achieve this, the arm 7 and the cases 4, 6 are connected so as to have a right angle relationship as shown in FIG. 33B.

Further, in the present embodiment, instead of the connector case 10, the connectors for external device connection 36 are provided in the side surfaces of the cases 4, 6.

(6) In the above described embodiment, the cases 4, 6 are provided with the fitting connectors 38. They are not essential.

(7) In the above described embodiment, the attachment 50 is mechanically electrically connected via a USB connector. Alternatively, the attachment 50 may be only mechanically connected and may receive power supply by means of Bluetooth communication or electromagnetic coupling. A structure for mechanical connection may be provided in addition to the connector.

(8) In the above described embodiment, the attachment 50 is provided with a camera, a sensor, a projector, etc. Instead of them or in addition to them, a distance image camera (a camera for capturing an image having distance data to an object for each captured pixel) may be provided.

(9) In the embodiment as shown in FIG. 25, positioning is performed by using design of desk, etc. as a featured image. Alternatively, a marker, etc. may be put on the desk as a featured image.

Alternatively, instead of or in addition to the positioning by using the featured image, a control may be performed such that movement of a projector in an image capturing direction is detected by a nine-axis sensor which is equipped with an acceleration sensor, an angular speed sensor, a geomagnetic sensor, etc., thereby fixedly displaying a captured image.

What is claimed is:

1. A neck-band type wearable computer comprising:
   a ring shaped main body having two ends with an open portion and adapted to be worn around a neck of a user;
   a computer within the main body;
   a battery housed in the main body to supply electric power to the computer; and
   connectors for external device connection provided on the main body and connected to the computer,
   wherein a fitting mechanism is provided in each of the ends of the ring shaped main body,
   wherein the wearable computer further comprises an attachment connectable between both fitting mechanisms, and
   wherein the attachment includes an electronic device.

2. The neck-band type wearable computer according to claim 1, wherein the connectors are provided at a center portion of the ring shaped main body.

3. The neck-band type wearable computer according to claim 1, further comprising:
   a short-range communication circuit housed in the main body and connected to the computer.

4. The neck-band type wearable computer according to claim 1, wherein at least a part of the center portion of the main body is equipped with a flexible arm.

5. The neck-band type wearable computer according to claim 4, wherein the flexible arm comprises:
   a coil made of cylindrically coiled wires; and
   a cover tube contacting a periphery of the coil, the cover tube being stretched so as to generate a contraction force in a direction in which the neighboring wires are brought into pressure contact with each other or being stretched so as to generate a contraction force in a radial direction by forming an inner diameter of the tube in a natural condition smaller than an outer diameter of the coil.

6. The neck-band type wearable computer according to claim 5, wherein the coil is made in a manner that a wire having a round cross section and a wire having an angular cross section are coiled such that the neighboring wires contact each other and are coiled in multiple streaks to be formed into a cylindrical coil.

7. The neck-band type wearable computer according to claim 5, wherein the cover tube comprises a silicone tube.

8. The neck-band type wearable computer according to claim 1, wherein the main body has a plane shape which allows a planar contact with the back of the neck at its center portion contacting the back of the neck and has two cases which allow a planar contact with the chest at its both ends for a stable condition.

9. The neck-band type wearable computer according to claim 8, wherein one of the cases houses the computer, and the other one of the cases houses the battery.

10. The neck-band type wearable computer according to claim 1, wherein, in one of the fitting mechanisms, the attachment is not detached when a force in a direction in which the attachment is pulled away from the main body is only applied, and, in the other one of the fitting mechanisms, a magnet is provided and the attachment is detached when a force in a direction in which the attachment is pulled away from the main body is applied.

11. The neck-band type wearable computer according to claim 1:
   wherein the electronic device is a camera;
   wherein the wearable computer further comprises a cover which openably/closably covers a lens of the camera; and
   wherein a display hidden by the cover becomes visible or invisible according to a difference in a physical position of the cover between an opened state and a closed state of the cover.

12. The neck-band type wearable computer according to claim 1:
   wherein the electronic device is a projector;
   wherein the projector is a laser projector for applying a laser beam onto an object while scanning in response to a display signal;
   wherein the projector comprises
      a detector adapted to detect whether a person or a part of a person is present in a direction of applying a laser beam at each scanning position, and
      performing CPU that performs, when a person or a part of a person is detected by the detector while applying a laser beam during scanning, control of i) not applying a laser beam thoroughly or ii) not applying a laser beam in a direction in which a person or a part of a person was detected but applying a laser beam in a direction in which a person or a part of a person was not detected.

13. The neck-band type wearable computer according to claim 1:
   wherein the electronic device comprises a mechanical apparatus to attach the electronic device to an object; and
   wherein the attachment comprises
      a housing recess for receiving the electronic device comprising the mechanical apparatus, and
      an attachment case provided with a code winding recess for winding the code around it.

14. A neck-band type wearable computer comprising:
   a ring shaped main body having two ends with an open portion and adapted to be worn around a neck of a user;
   a computer within the main body;
   a battery housed in the main body to supply electric power to the computer; and
   connectors for external device connection or a short-range communication device provided in the main body for connection with the computer;
   wherein a projector and a detector are connected to the computer via the connectors or the short-range communication device;
   wherein the projector projects an image of a keyboard onto an object;
   wherein the detector acquires input information by detecting movement of a finger on the keyboard projected on the object; and
   wherein the computer displays a processing result on the monitor on the basis of the input information;
   wherein the computer updates data that controls the display of the image of the keyboard at least based on a direction and a distance to the object so that the image of the keyboard can be displayed at predetermined position independent of movement of the user wearing the neck-band type wearable computer.

15. A wearable computer comprising:
   a flexible arm to be wound around a part of a human body, the flexible arm having two ends with an open portion;
   storage cases attached to both ends of the flexible arm, the storage cases including respective male and female engaging mechanisms or magnets to connect the storage cases to one another to form a loop;
   a computer built in one of the storage cases; and
   a battery housed in the other of the storage cases to supply electric power to the computer via a connection.

16. The wearable computer according to claim 15, further comprising:
   a center case attached to a center of the flexible arm; and
   connectors for external device connection provided in the center case and connected to the computer.

17. The wearable computer according to claim 15, wherein the part of the human body is the wrist or the ankle.

18. A neck-band type wearable computer having the projector comprising:
   a ring shaped main body having an open portion for wearing around a neck of a user;
   a computer built in the main body;
   a battery housed in the main body to supply electric power to the computer; and
   connectors for external device connection provided on the main body and connected to the computer,
   wherein the projector is a laser projector that directs a laser beam onto an object while scanning in response to a display signal;
   wherein the projector comprises:
      a detector that detects whether a person or a part of a person is present in a direction of applying a laser beam at each scanning position, and
      a CPU that performs, when a person or a part of a person is detected by the detector while applying a laser beam during scanning, control of i) not applying a laser beam or ii) not applying a laser beam in a direction in which a person or a part of a person was detected but applying a laser beam in a direction in which a person or a part of a person was not detected.

* * * * *